(12) United States Patent
Darwish et al.

(10) Patent No.: US 9,076,861 B2
(45) Date of Patent: Jul. 7, 2015

(54) SCHOTTKY AND MOSFET+SCHOTTKY STRUCTURES, DEVICES, AND METHODS

(71) Applicant: MaxPower Semiconductor, Inc., Santa Clara, CA (US)

(72) Inventors: Mohamed N. Darwish, Campbell, CA (US); Jun Zeng, Torrance, CA (US); Richard A. Blanchard, Los Altos, CA (US)

(73) Assignee: MaxPower Semiconductor, Inc., San Jose, CA (US)

( * ) Notice: Subject to any disclaimer, the term of this patent is extended or adjusted under 35 U.S.C. 154(b) by 0 days.

(21) Appl. No.: 14/202,471

(22) Filed: Mar. 10, 2014

(65) Prior Publication Data

US 2014/0252463 A1    Sep. 11, 2014

Related U.S. Application Data

(63) Continuation of application No. 13/212,044, filed on Aug. 17, 2011, now Pat. No. 8,704,295, which is a continuation-in-part of application No. 12/368,399, filed on Feb. 10, 2009, now Pat. No. 8,076,719.

(60) Provisional application No. 61/378,929, filed on Aug. 31, 2010, provisional application No. 61/065,759, filed on Feb. 14, 2008.

(51) Int. Cl.
| | |
|---|---|
| *H01L 29/78* | (2006.01) |
| *H01L 29/40* | (2006.01) |
| *H01L 29/66* | (2006.01) |
| *H01L 29/872* | (2006.01) |
| *H01L 29/417* | (2006.01) |
| *H01L 29/423* | (2006.01) |
| *H01L 29/06* | (2006.01) |
| *H01L 29/08* | (2006.01) |
| *H01L 29/10* | (2006.01) |

(52) U.S. Cl.
CPC .......... *H01L 29/7806* (2013.01); *H01L 29/407* (2013.01); *H01L 29/41766* (2013.01); *H01L 29/42368* (2013.01); *H01L 29/66727* (2013.01); *H01L 29/66734* (2013.01); *H01L 29/7813* (2013.01); *H01L 29/0623* (2013.01); *H01L 29/0634* (2013.01); *H01L 29/0696* (2013.01); *H01L 29/0878* (2013.01); *H01L 29/1095* (2013.01); *H01L 29/872* (2013.01)

(58) Field of Classification Search
CPC .............. H01L 29/7806; H01L 29/407; H01L 29/66727; H01L 29/66734; H01L 29/7813; H01L 29/0634; H01L 29/872
See application file for complete search history.

(56) References Cited

U.S. PATENT DOCUMENTS 8,704,295 B1 * 4/2014 Darwish et al. ............... 257/330

* cited by examiner

*Primary Examiner* — Long Pham
(74) *Attorney, Agent, or Firm* — Gwendolyn S. S. Groover; Robert O. Groover, III; Groover & Associates PLLC

(57) ABSTRACT

Power devices which include trench Schottky barrier diodes and also (preferably) trench-gate transistors. Isolation trenches flank both the gate regions and the diode mesas, and have an additional diffusion below the bottom of the isolation trenches. The additional diffusion helps to reduce the electric field (and leakage), when the device is in the OFF state, at both the Schottky barrier and at the body diode.

19 Claims, 34 Drawing Sheets

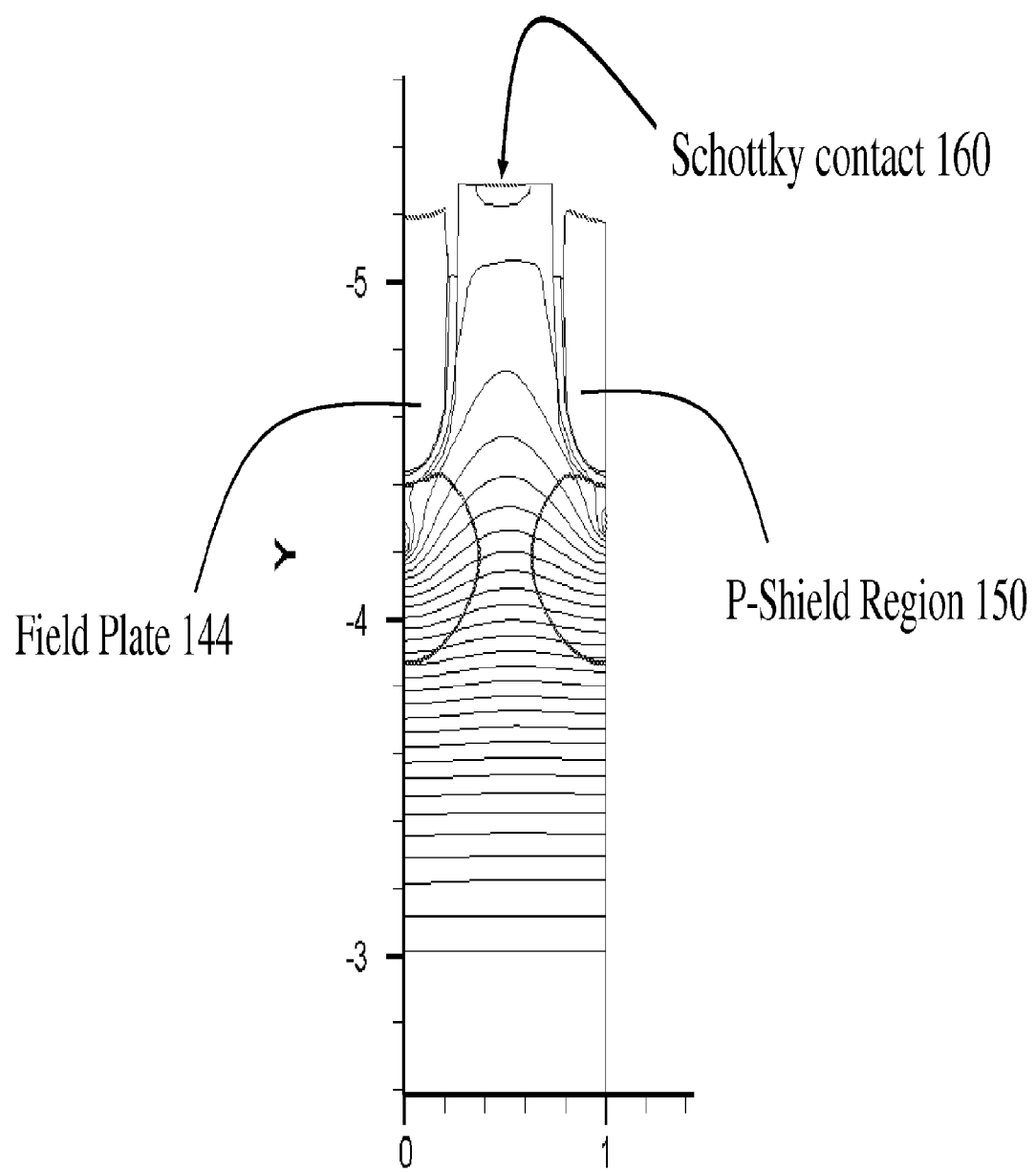
Fig.22: Potential contours at applied Drain voltage of 33V

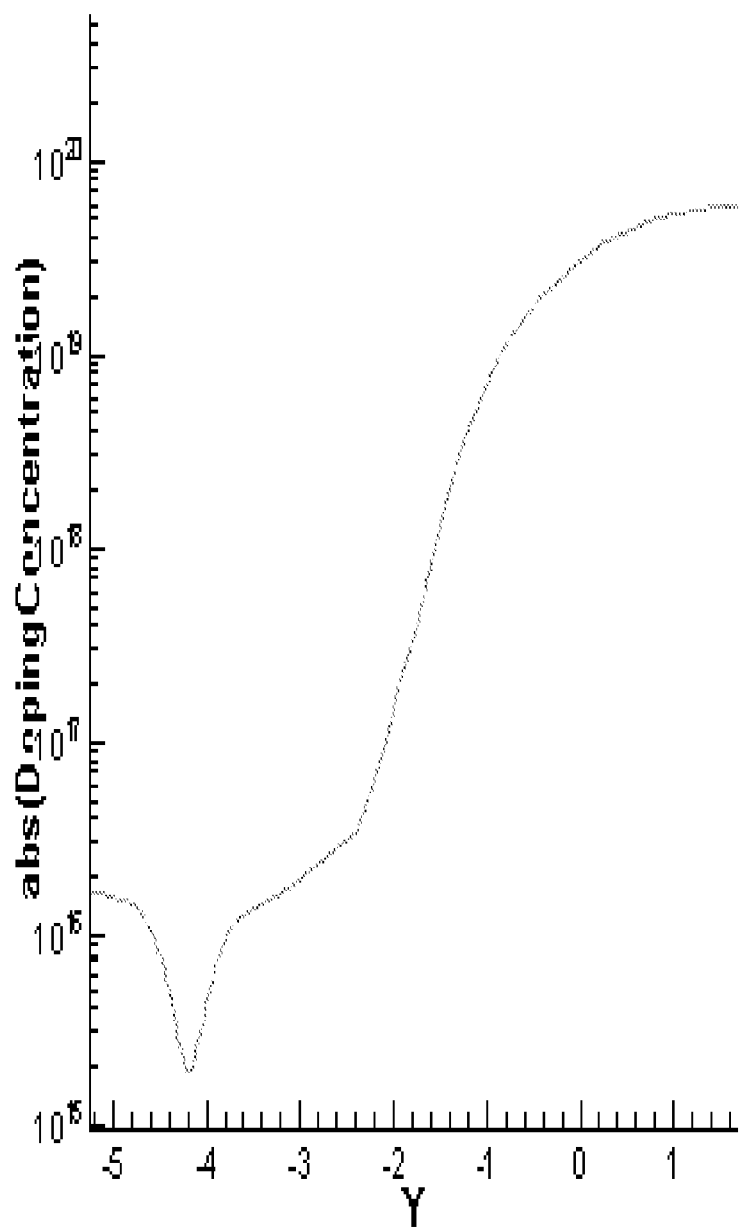
Fig.23: Doping profile at cross section across the middle of the cell.

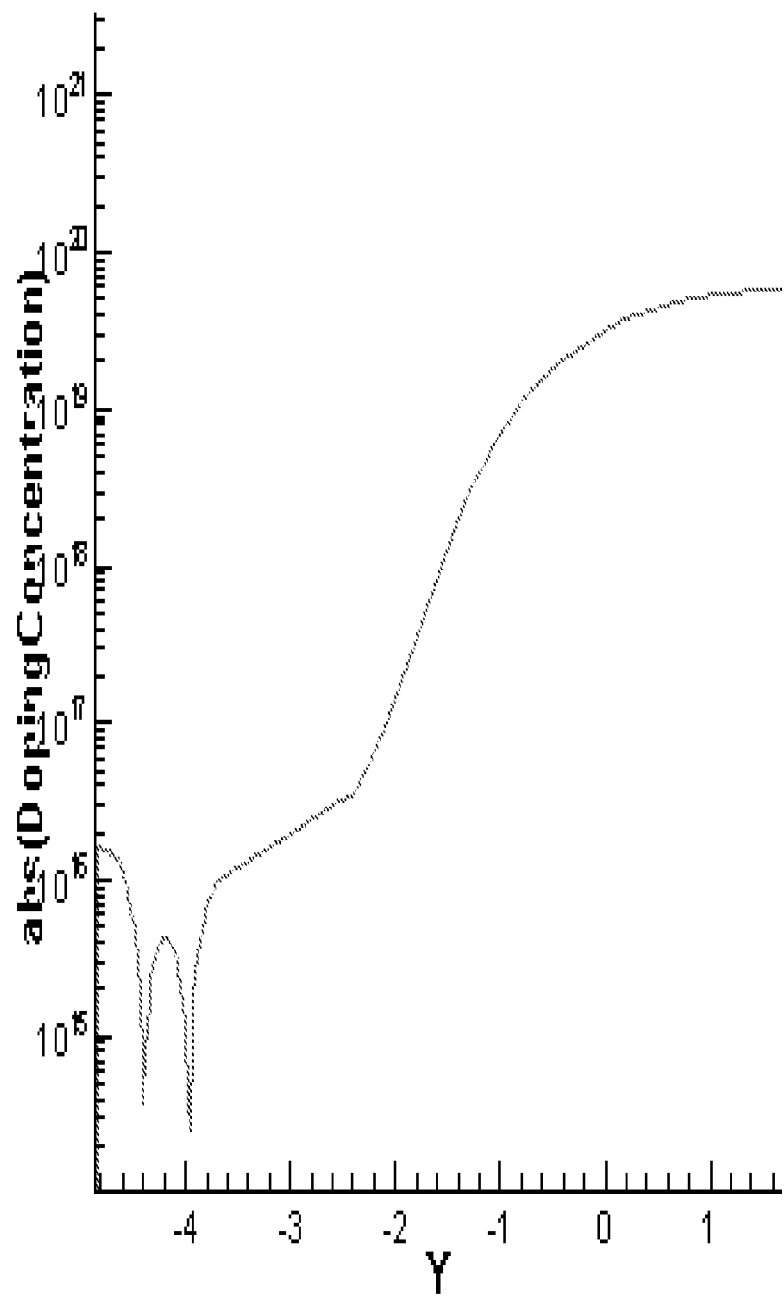
Fig.24: Doping profile at cross section across a line 0.1um from the trench.

SCHOTTKY AND MOSFET+SCHOTTKY STRUCTURES, DEVICES, AND METHODS

CROSS-REFERENCE

Priority is claimed from U.S. provisional application 61/378,929 filed Aug. 31, 2010, which is hereby incorporated by reference. Priority is also claimed from Ser. No. 12/368, 399 filed Feb. 10, 2009, and therethrough from provisional 61/065,759 filed Feb. 14, 2008. All of these applications are hereby incorporated by reference.

BACKGROUND

The present application relates to power semiconductor devices, methods, and structures, and more particularly to those using predominantly vertical current flow.

Note that the points discussed below may reflect the hindsight gained from the disclosed inventions, and are not necessarily admitted to be prior art.

Trench Schottky Barrier Diodes ("SBD"s) such as shown in FIG. 1A are widely used in many power conversion applications such as dc-dc converters. In applications where the transistor may be forward biased—i.e. where the source terminal is more positive than the drain terminal, in an n-channel device—the Schottky Barrier Diode provides a diode which can be used as the "free-wheeling diode" in many converter topologies. Often the Schottky Barrier Diode is electrically connected in parallel with the body junction, since the Schottky Barrier Diode provides a lower forward voltage drop, and avoids minority carrier injection. The Schottky Barrier Diode will also typically have a lower stored charge in reverse recovery, which reduces switching losses in circuits which include forward-bias phases.

It is desirable that Schottky Barrier Diodes provide low forward voltage drop to reduce power losses. Trench Schottky Barrier structures such as shown in FIG. 1A suffer from relatively higher leakage current at reverse bias. This drawback is especially important for monolithically integrated MOSFET-SBD structures such as Trench MOSFET Barrier Structures (TMBS).

New power MOSFET structures were disclosed for example in US published patent applications 2008/0073707 and 2009/0206924, and in provisional applications 61/326, 210 and 61/334,573, all of which are hereby incorporated by reference. These applications variously disclosed Recessed Field Plate (RFP), Embedded Field Plate (EFP), and Embedded Shielded Field Plate (ESFP) structures. Such MOSFET structures provide low specific on-resistance, lower gate-drain charge $Q_{gd}$, and lower gate charge $Q_g$.

SUMMARY

The present application discloses new approaches to Schottky Barrier Diodes with low leakage current and low forward voltage drop. The present application also discloses MOSFET+SBD merged device structures with low reverse recovery charge Qrr.

The disclosed innovations, in various embodiments, provide one or more of at least the following advantages. However, not all of these advantages result from every one of the innovations disclosed, and this list of advantages does not limit the various claimed inventions.

Reduction in reverse recovery charge.

Low leakage current and low forward voltage drop Schottky Barrier Diodes.

Integration of low leakage and low forward voltage drop Schottky Barrier Diodes with MOSFET structures.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 22 shows a two-dimensional simulation of isopotential contours of a device as described above.

FIG. 23 and FIG. 24 show doping profiles for the device simulated in FIG. 22.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 1:
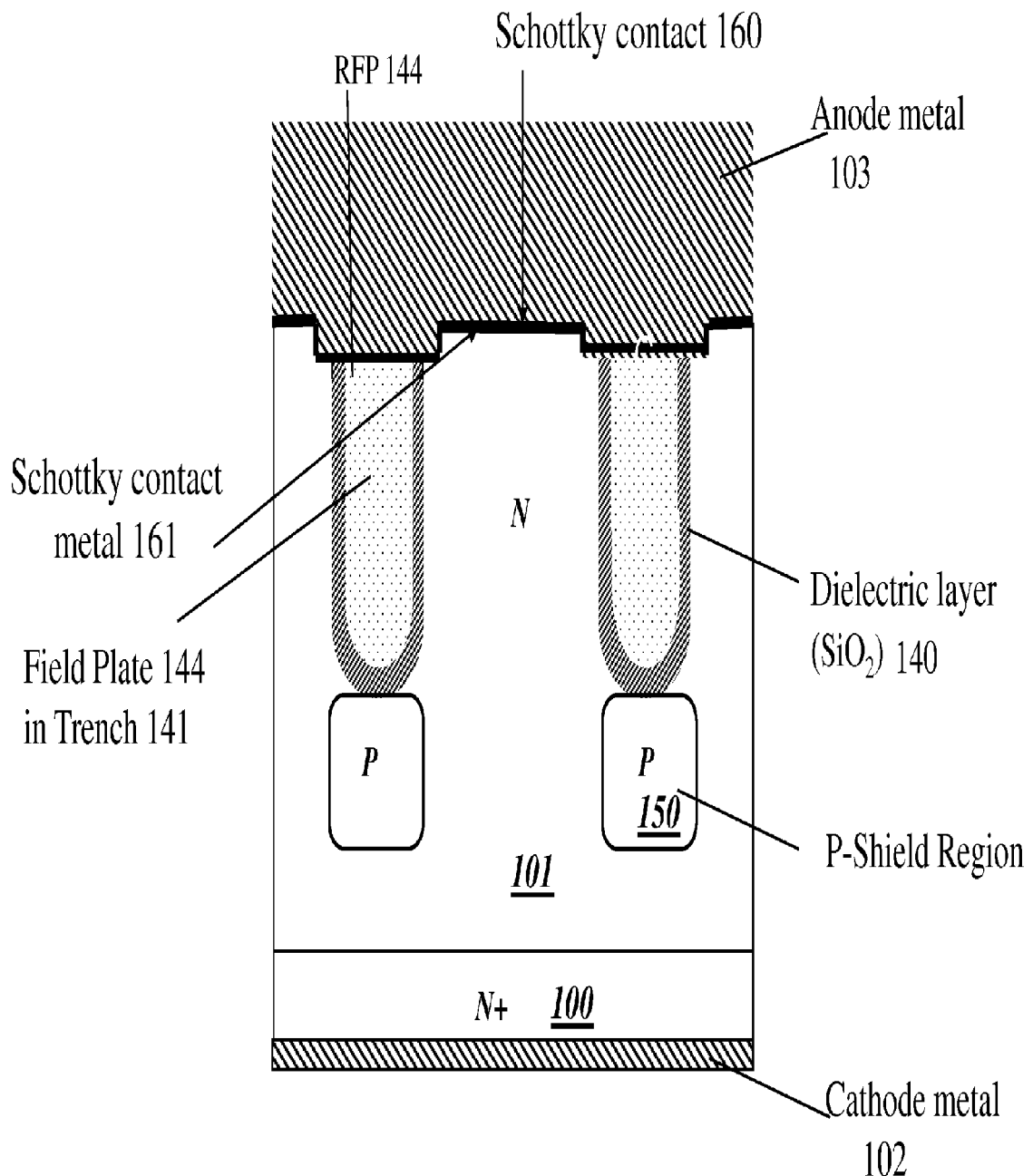
FIG. 1 shows an embodiment of a new Schottky Barrier Diode structure.
Figure 1A:
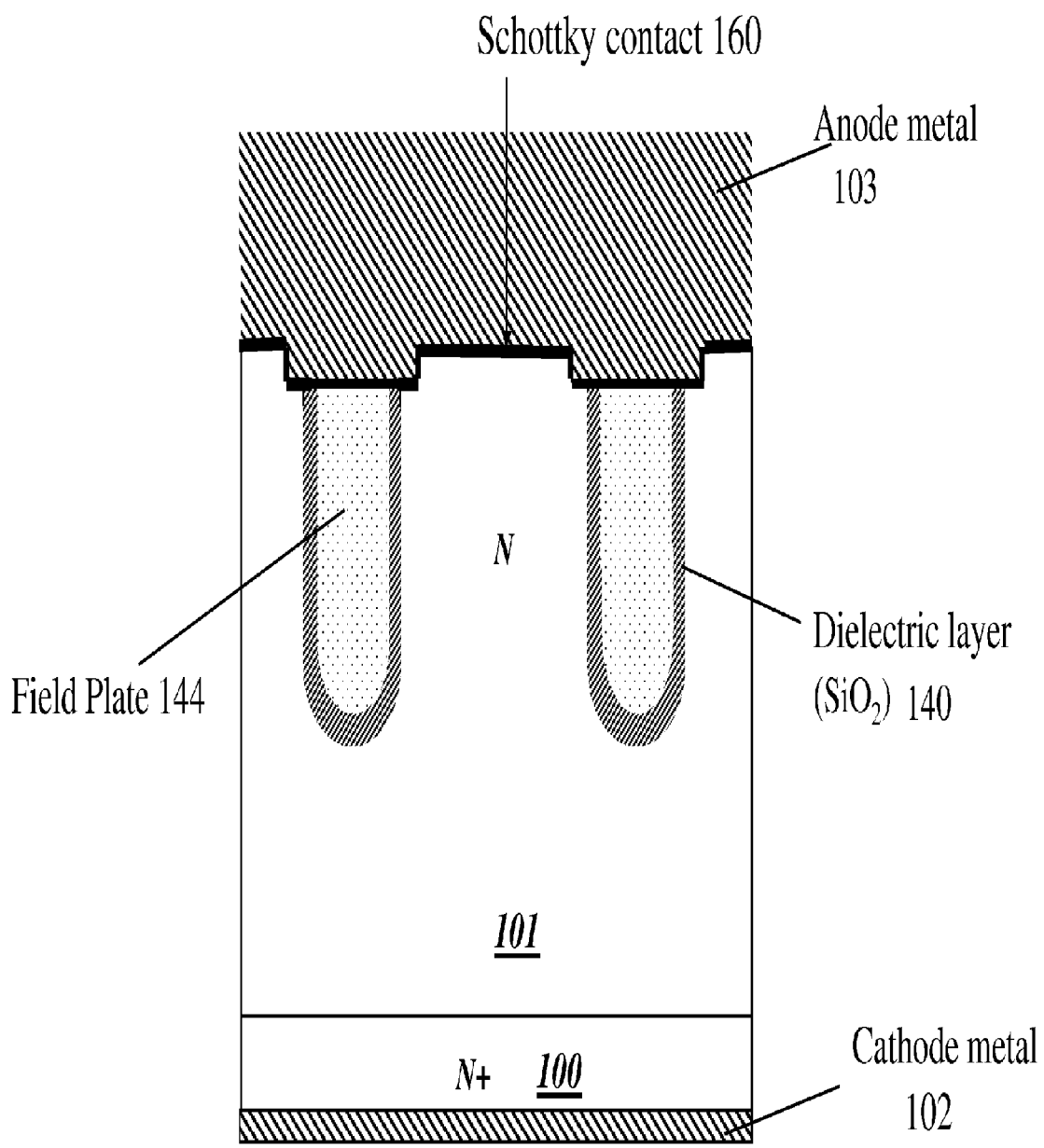
FIG. 1A shows an example of previously proposed Trench Schottky Barrier Diodes.

FIG. 1 shows an embodiment of a new Schottky Barrier Diode structure that has P-shield layers 150 below the Recessed Field Plate trenches (RFP) 141. The P-shield regions 150 help to reduce the electric field at the Schottky contact 160 at reverse bias, and this results in lower leakage current. By choosing a suitable barrier material 161, the Schottky contact 160 provides a good combination of lower forward voltage drop and low leakage current Schottky Barrier Diode. The metal 161 can be, for example, platinum or titanium silicide. The semiconductor material at the Schottky contact has a low enough doping to avoid ohmic contact, e.g. $10^{16}$ cm$^{-3}$ or less n-type. The P-shield regions 150 can optionally be floating, or connected to the anode electrode at other locations of the structures (not shown). An n-type drift region 101 overlies n+ substrate 100, and is preferably provided by an n-on-n+ epitaxial structure. The trenches 141, which contain field plates 144 (e.g. of doped polysilicon, insulated from the semiconductor material 101 by dielectric layer 140), provide field-shaping for improved breakdown characteristics. Thus cathode metallization 102 and anode metallization 103 provide a complete two-terminal device. In the example shown, the field plates are Recessed Field Plates (RFPs), and are contacted by anode metal 103 (which may for example be aluminum).

Figure 2:
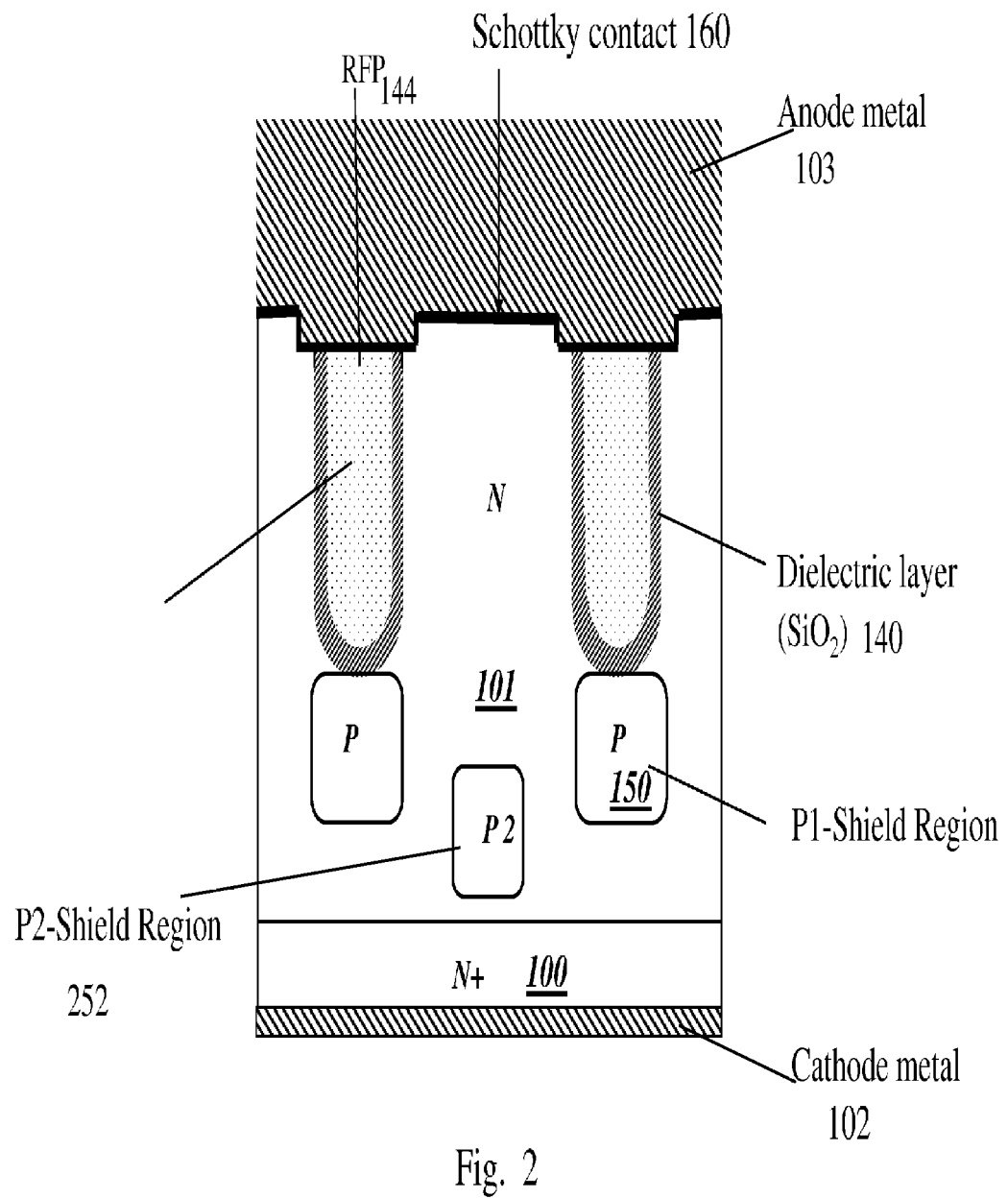
FIG. 2 shows another embodiment of a new Schottky Barrier Diode structure, which has additional P-shield regions.

FIG. 2 shows another embodiment which is generally somewhat similar to that shown in FIG. 1, except that it has additional P-shield regions (P2) 252. This change provides additional spacing of isopotential curves or shielding in the OFF state, and hence reduces the peak electric field.

FIGS. 3-12 show different embodiments of new Schottky Barrier Diode structures.

Figure 3:
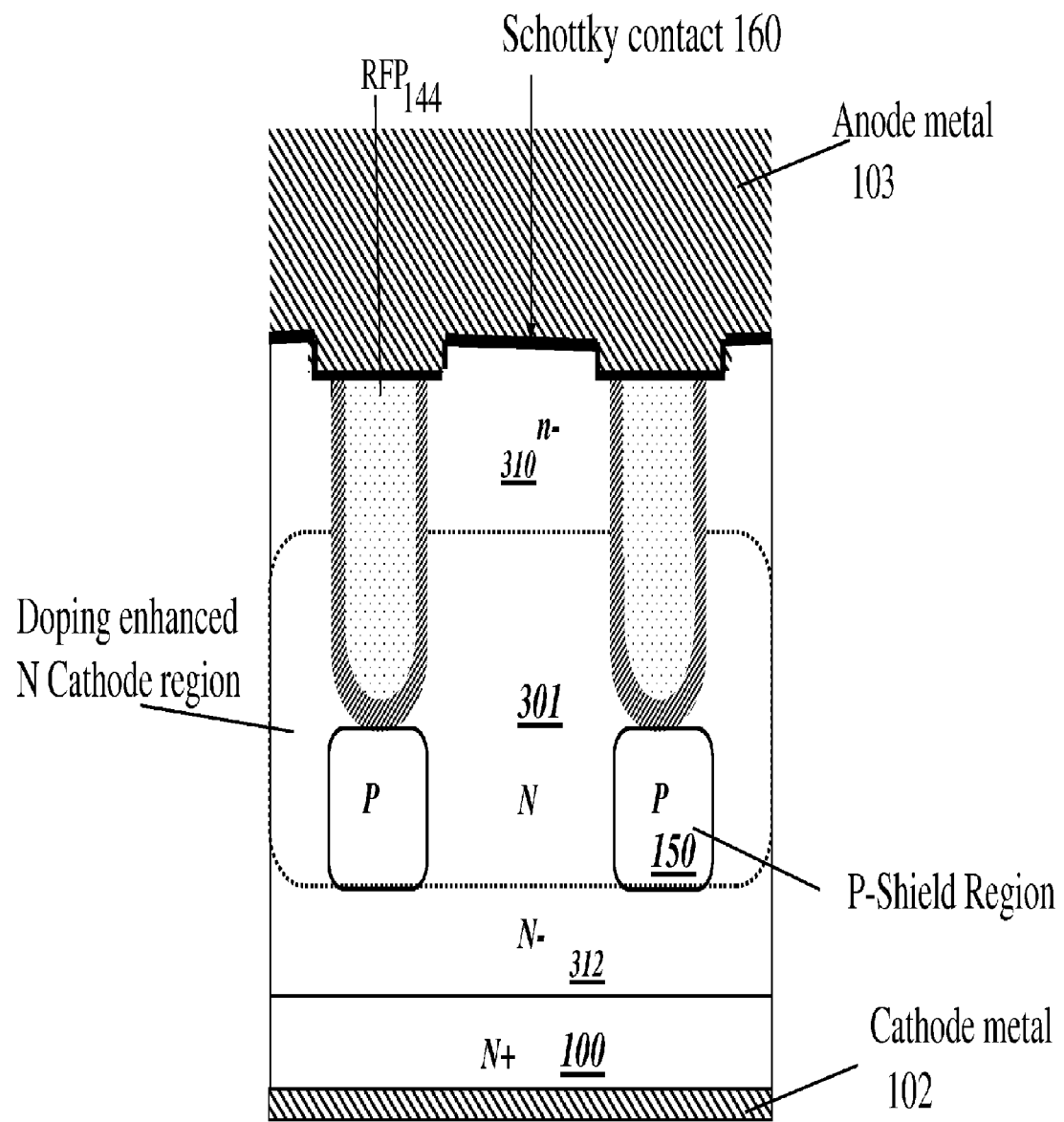
FIG. 3 shows another embodiment of a new Schottky Barrier Diode structure, which has a locally enhanced doping cathode region.

FIG. 3 shows another embodiment of a Schottky Barrier Diode structure which is generally somewhat similar to that shown in FIG. 1, except that it has a locally enhanced doping cathode region 301 to lower the Schottky Barrier Diode series resistance. The Schottky barrier metal 160 makes contact with the upper n-type section of silicon 310, and a layer of N-silicon 312 separates the locally enhanced doping cathode region 301 from the N+ substrate 100. (The regions 310, 301, and 312 all are located within the original n-type epitaxial layer 101.) This enhancement doping region is an important addition to the structure of FIG. 1, since it allows the epitaxial layer doping to be optimized for best Schottky contact characteristics while avoiding excess series resistance.

The n-type doping in region 301 is preferably 2 times to 10 times that of the drift region closer to the Schottky barrier. This will be set by the doping of the epitaxial layer, which can be, for example, $1 \times 10^{16}$ cm$^{-3}$, or more generally in the range from $3 \times 10^{15}$ cm$^{-3}$ to $5 \times 10^{17}$ cm$^{-3}$.

In general, a Schottky diode without a p-type guard ring has the breakdown voltage of a very shallow junction. With the addition of a p-type ring, the breakdown voltage becomes essentially that of a pn-junction diode having the equivalent junction depth (i.e. the depth of the depletion layer beneath the Schottky metal). Typically the semiconductor doping for a Schottky barrier, in power devices, will be a few times $10^{16}$ cm$^{-3}$ or less, n-type.

Figure 4:
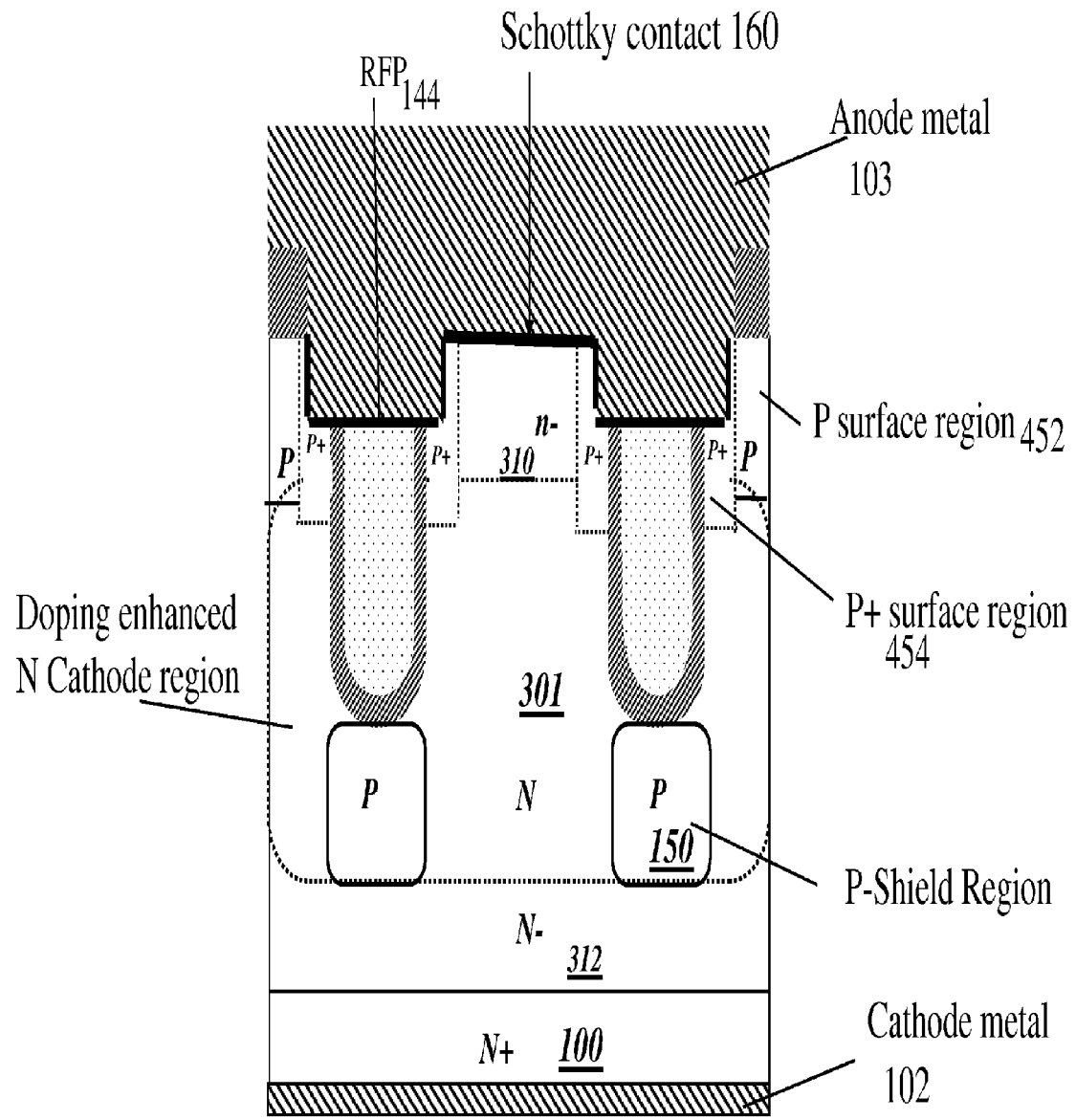
FIG. 4 shows another embodiment of a new Schottky Barrier Diode structure, which has surface P regions and P+ contact regions.

FIG. 4 shows another embodiment of a Schottky Barrier Diode structure which is generally somewhat similar to that shown in FIG. 3, except that it has surface P regions 452 and P+ contact regions 454. As discussed below, these can advantageously be provided by the body and body contact diffusions in the MOSFET array. As shown in this example, the P+ contact region 454 can be optionally deeper than the P-surface region 452.

Figure 5A:
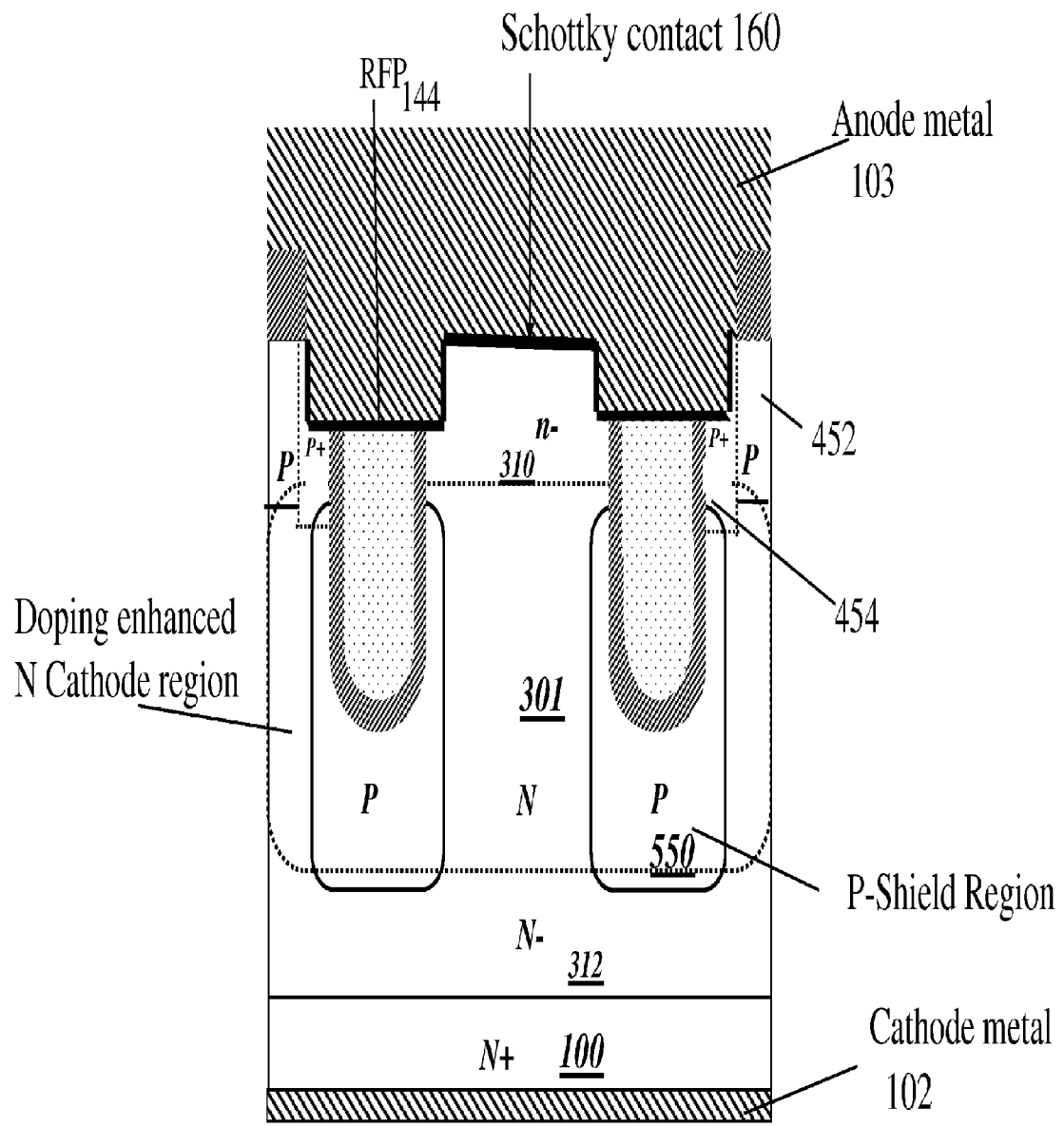
FIG. 5A shows another embodiment of a new Schottky Barrier Diode structure, which has larger P-type shield regions.

FIG. 5A shows another embodiment of a Schottky Barrier Diode structure which is generally somewhat similar to that shown in FIG. 4, except that it has larger P-type shield regions 550 that extend and connect to the P-surface 452 and/or P+ contact 454 regions. Note that the shield regions, in this example, lie not only beneath the trench, but some parts of the shield region laterally surround parts of the trench.

Figure 5B:
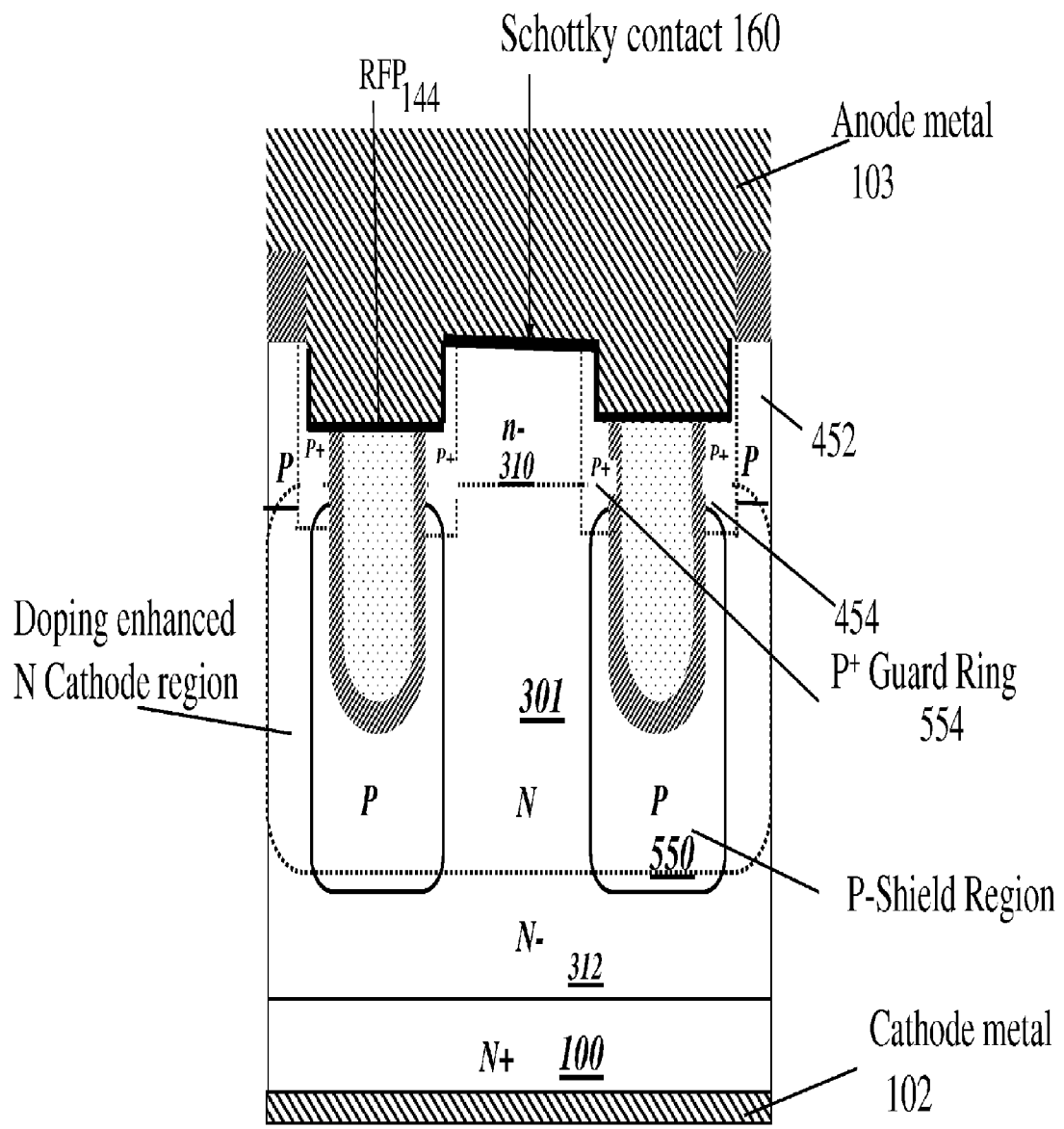
FIG. 5B shows another embodiment of a new Schottky Barrier Diode structure, which has a p+ guard ring Schottky contact.

FIG. 5B shows another embodiment of a Schottky Barrier Diode structure which is generally somewhat similar to that shown in FIG. 5A, except that the p+ diffusion 454 extends into the mesa where the Schottky contact 160 is located, to provide a p+ guard ring 554. Also note that the p+ diffusion 454 extends down to make contact with the p-type shield region 550.

Figure 6A:
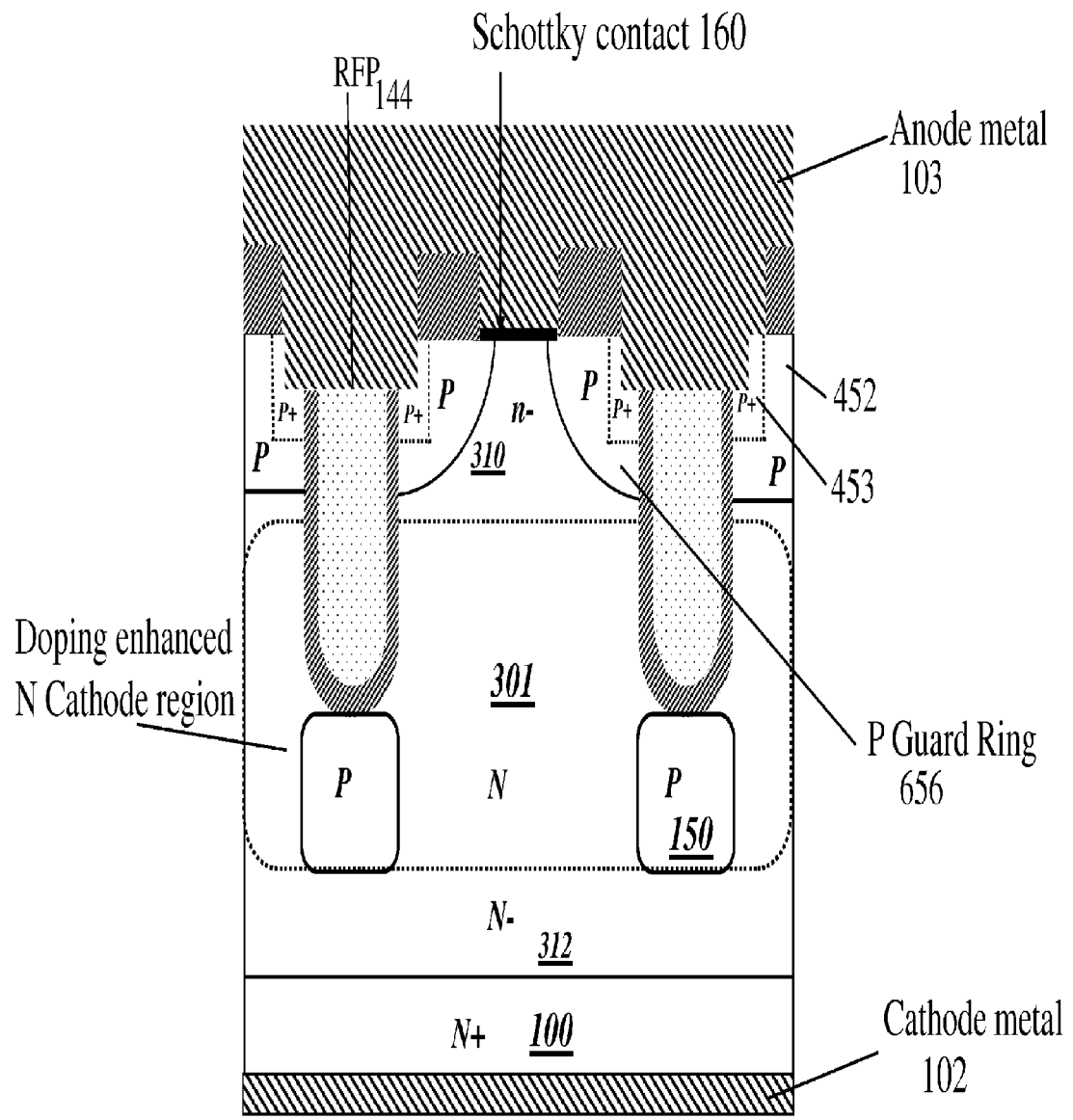
FIG. 6A shows another embodiment of a new Schottky Barrier Diode structure, which has shaped P-guard ring regions.

FIG. 6A shows another embodiment of a Schottky Barrier Diode structure which is generally somewhat similar to that shown in FIG. 5A, except that it has shaped P-guard ring regions 656 that further reduce the peak electric field at the Schottky barrier contact 160 at reverse bias to lower the leakage current. The regions 656 are preferably provided by the same diffusion 452 which forms the body region of trench transistors in other locations, as described below.

Note that, in this example, the P-guard ring regions 656 overlap the edges of the barrier contact 160. This structure provides important advantages. Especially in integrated structures which combine trench transistors with Schottky diodes, the use of the edge of the body region to provide a guard ring which overlaps the Schottky contact provides an important reduction in leakage, without requiring any additional fabrication steps.

Figure 6B:
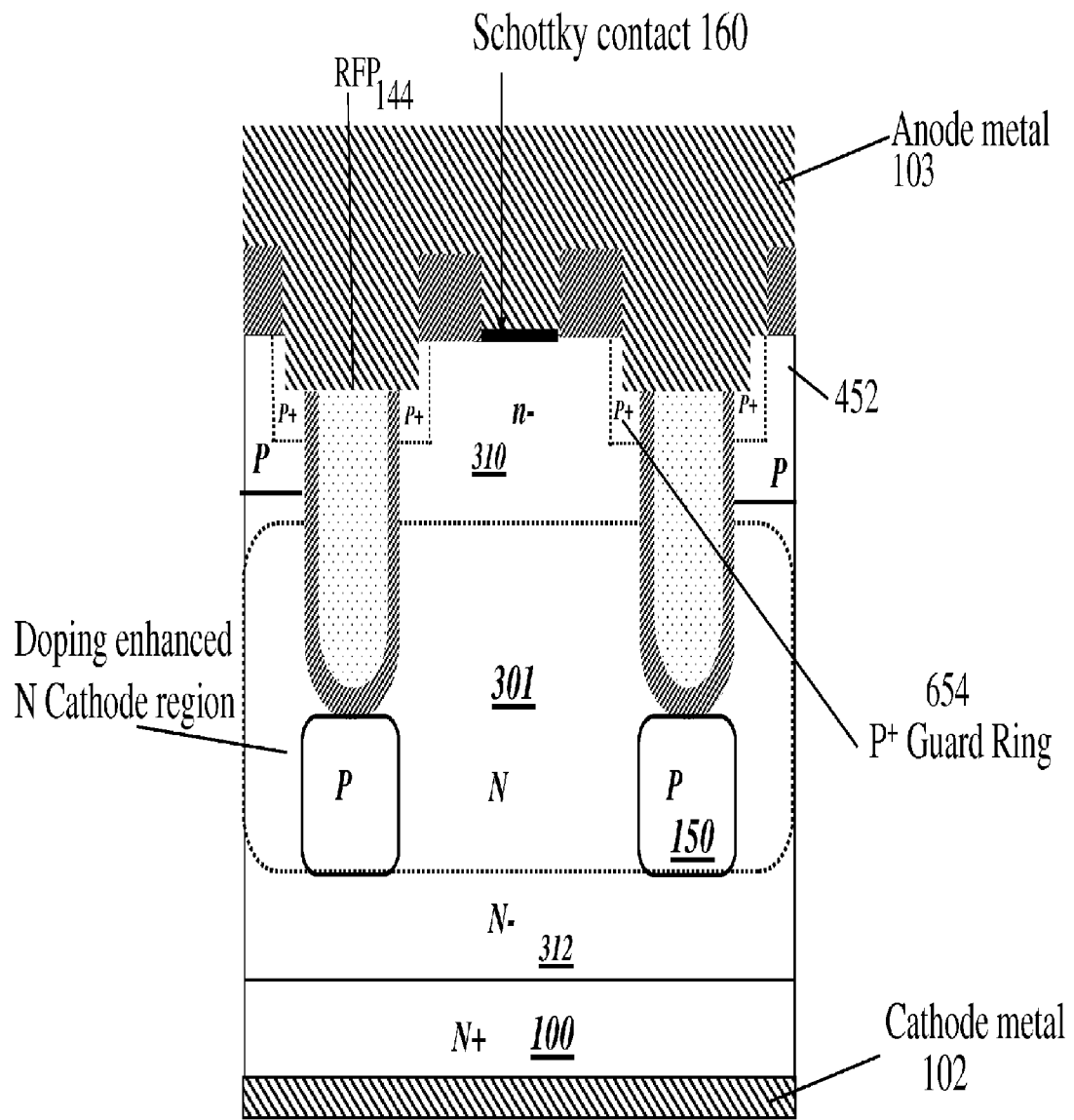
FIG. 6B shows another embodiment of a new Schottky Barrier Diode structure, which has a p+ guard ring provided by the p+ body contact diffusion.

FIG. 6B shows another embodiment of a Schottky Barrier Diode structure which is generally somewhat similar to that shown in FIG. 6A, except that it has a p+ guard ring 654. This is preferably provided by the same p+ diffusion 453 which provides the body contact diffusion in active device areas.

Figure 7:
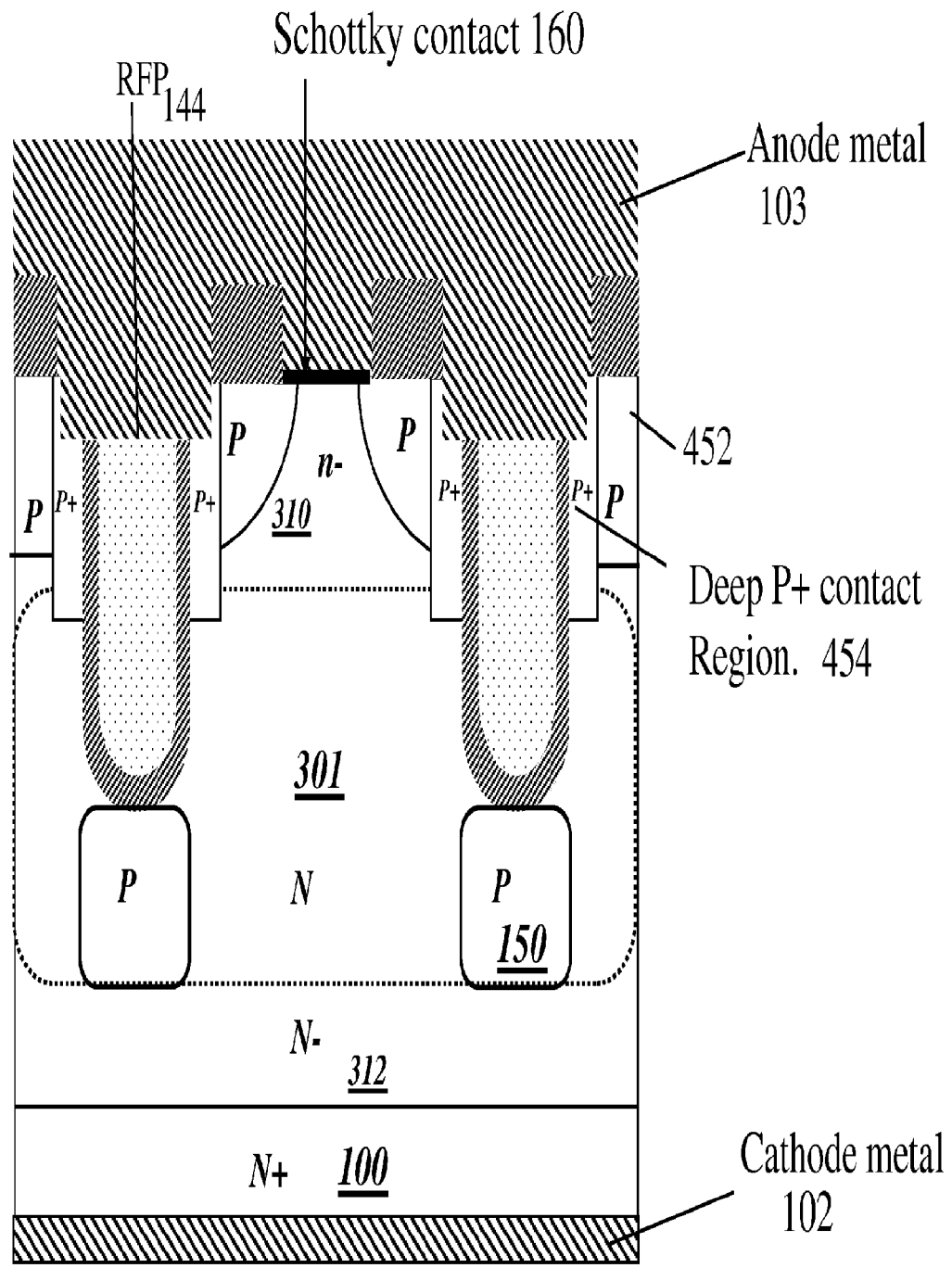
FIG. 7 shows another embodiment of a new Schottky Barrier Diode structure, which has a deeper P+ contact region.

FIG. 7 shows another embodiment of a Schottky Barrier Diode structure which is generally somewhat similar to that shown in FIG. 6A, except that it has a deeper P+ contact region 454.

Figure 8:
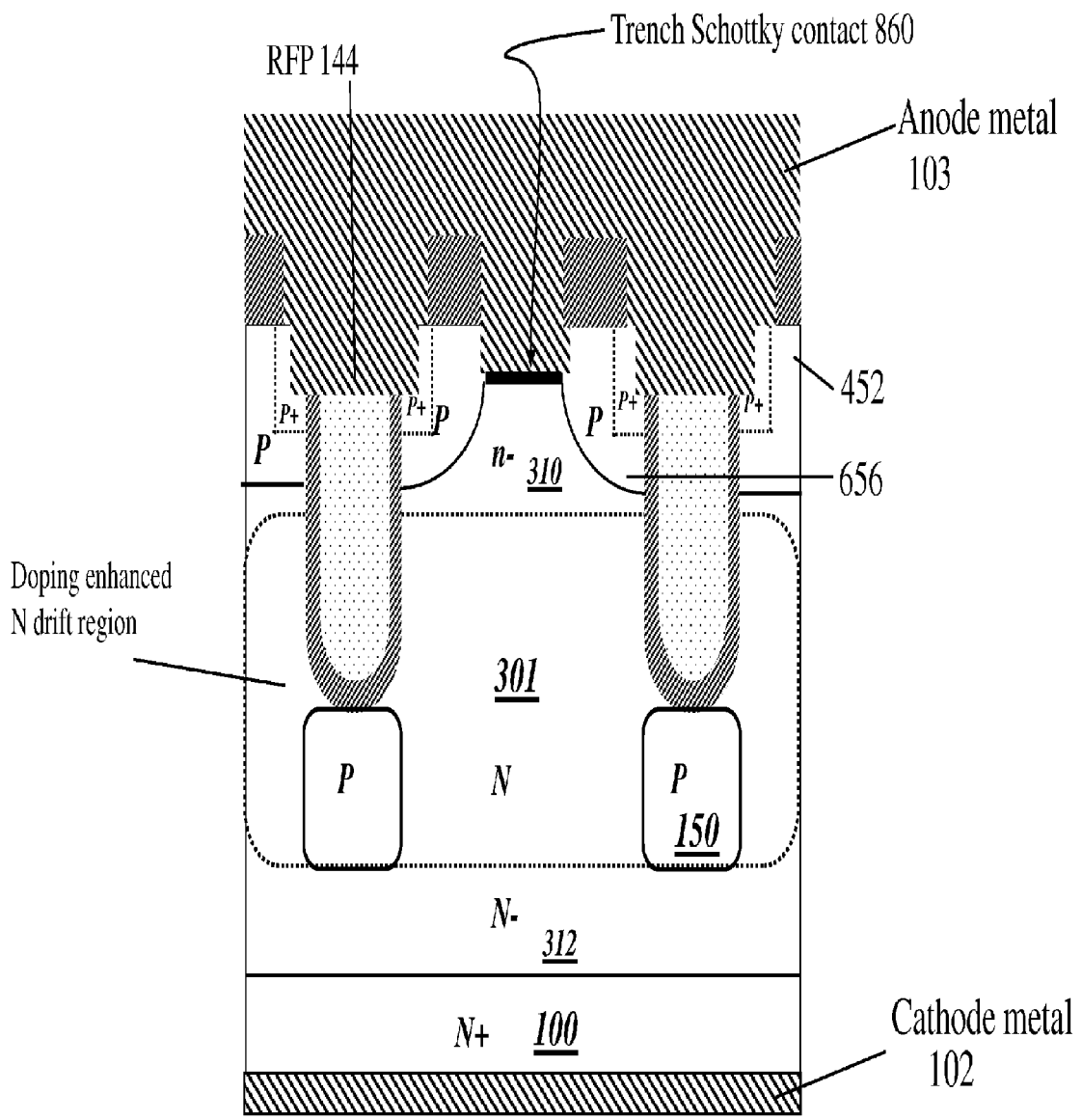
FIG. 8 shows another embodiment of a new Schottky Barrier Diode structure, which has a recessed or trench Schottky barrier contact.

FIG. 8 shows another embodiment of a Schottky Barrier Diode structure which is generally somewhat similar to that shown in FIG. 6B, except that it has a recessed or trench Schottky barrier contact 860.

FIGS. 9, 10, 11 and 12 show other embodiments of new Schottky Barrier Diode structures which are generally somewhat similar to those previously shown, except that they include Embedded Field Plates (EFP) 944, which are not contacted by the frontside metal in the locations shown. (Contact would normally be made at other locations, as discussed below.) The conductive material of the field plate 944 (such as doped polysilicon) is covered by dielectric material 940 such as silicon dioxide.

Figure 9:
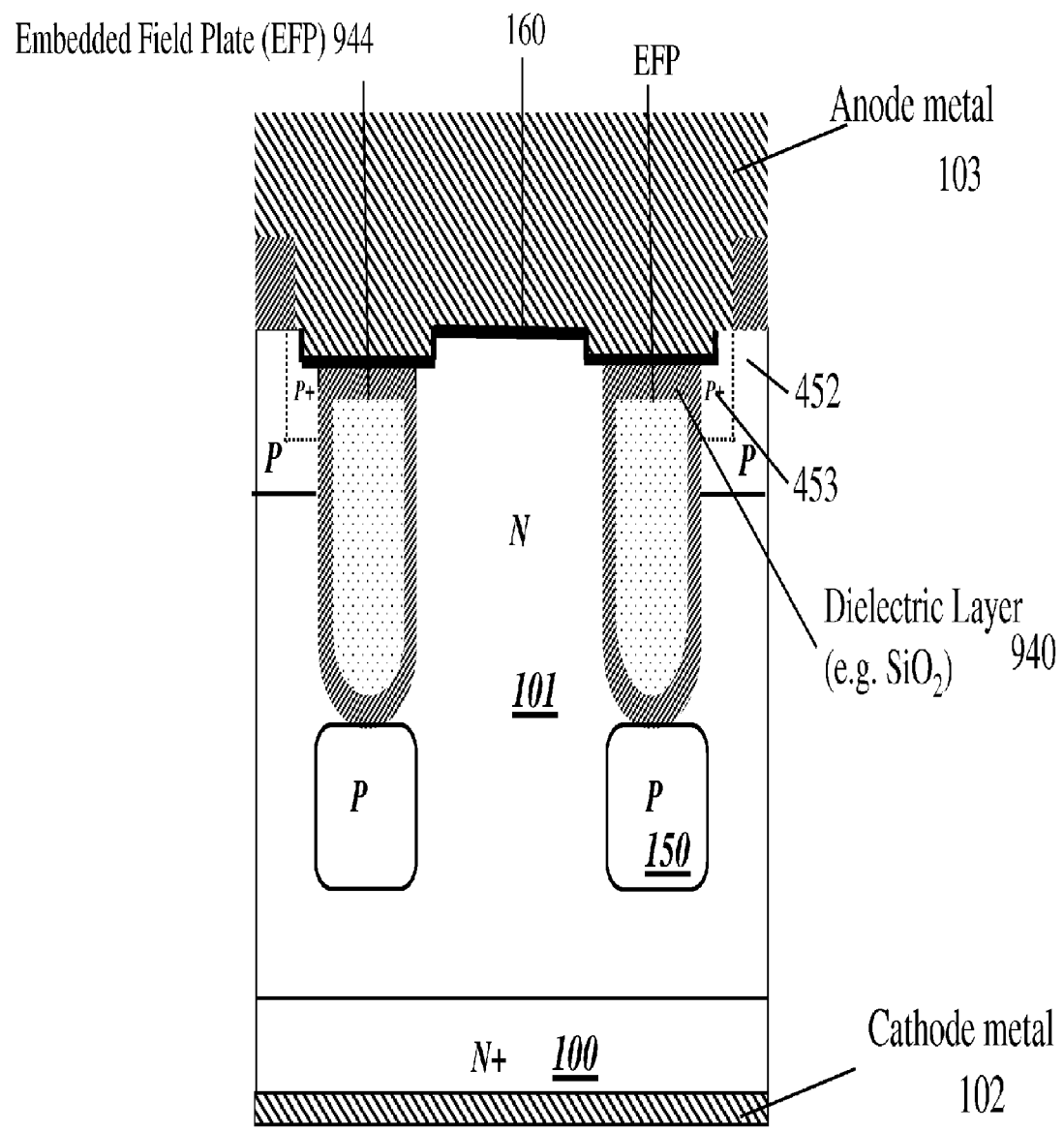
FIG. 9 shows another embodiment of a new Schottky Barrier Diode structure, which has P-shield layers.

FIG. 9 shows an embodiment of a new Schottky Barrier Diode structure which has P-shield layers 150 below the trenches containing Embedded Field Plate trenches (RFP) 944.

Figure 10:
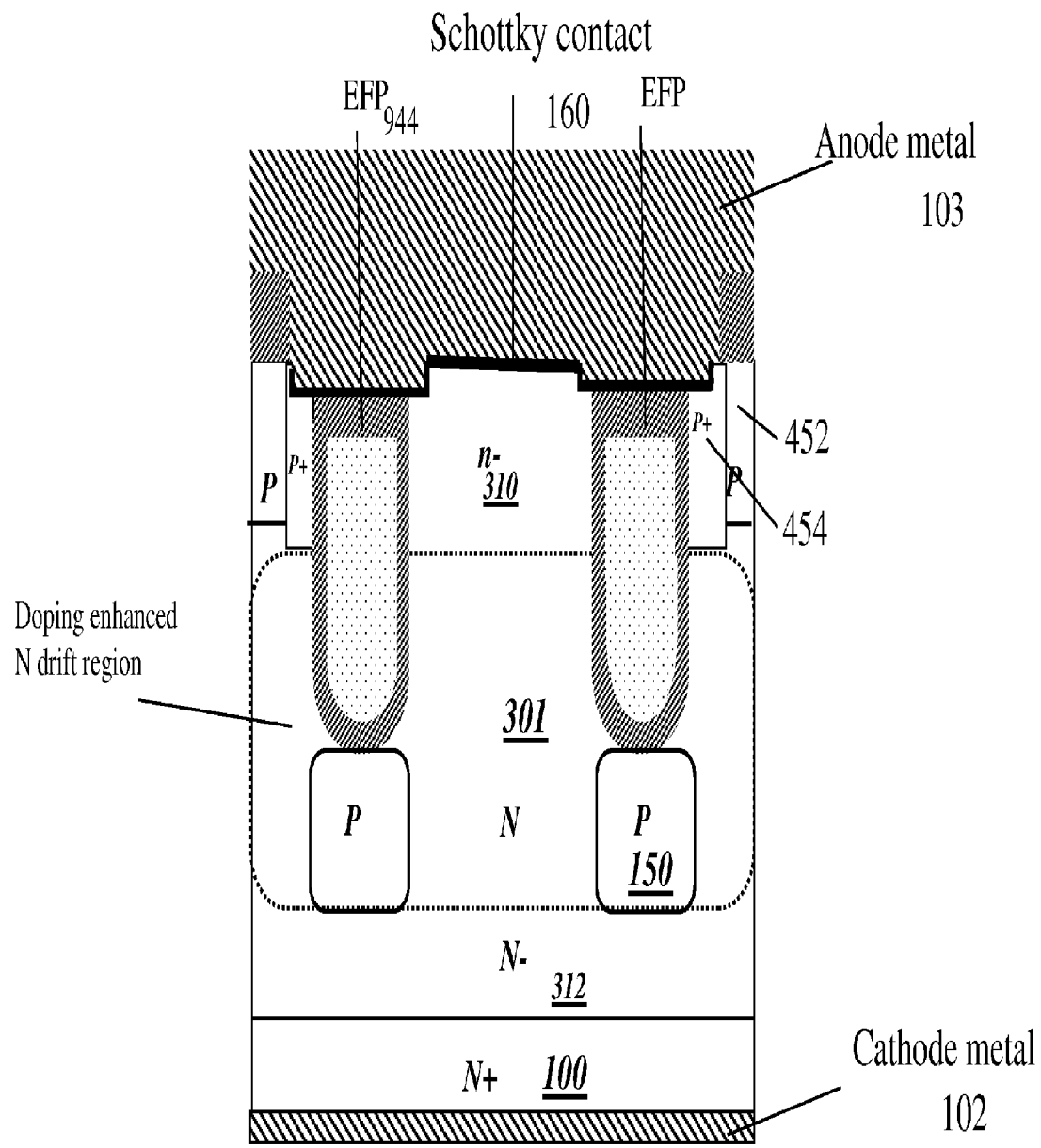
FIG. 10 shows another embodiment of a new Schottky Barrier Diode structure, which has a locally enhanced doping cathode region.

FIG. 10 shows another embodiment of a Schottky Barrier Diode structure which is generally somewhat similar to that shown in FIG. 9, except that it also has a locally enhanced doping cathode region 301 to lower the Schottky Barrier Diode series resistance.

Figure 11:
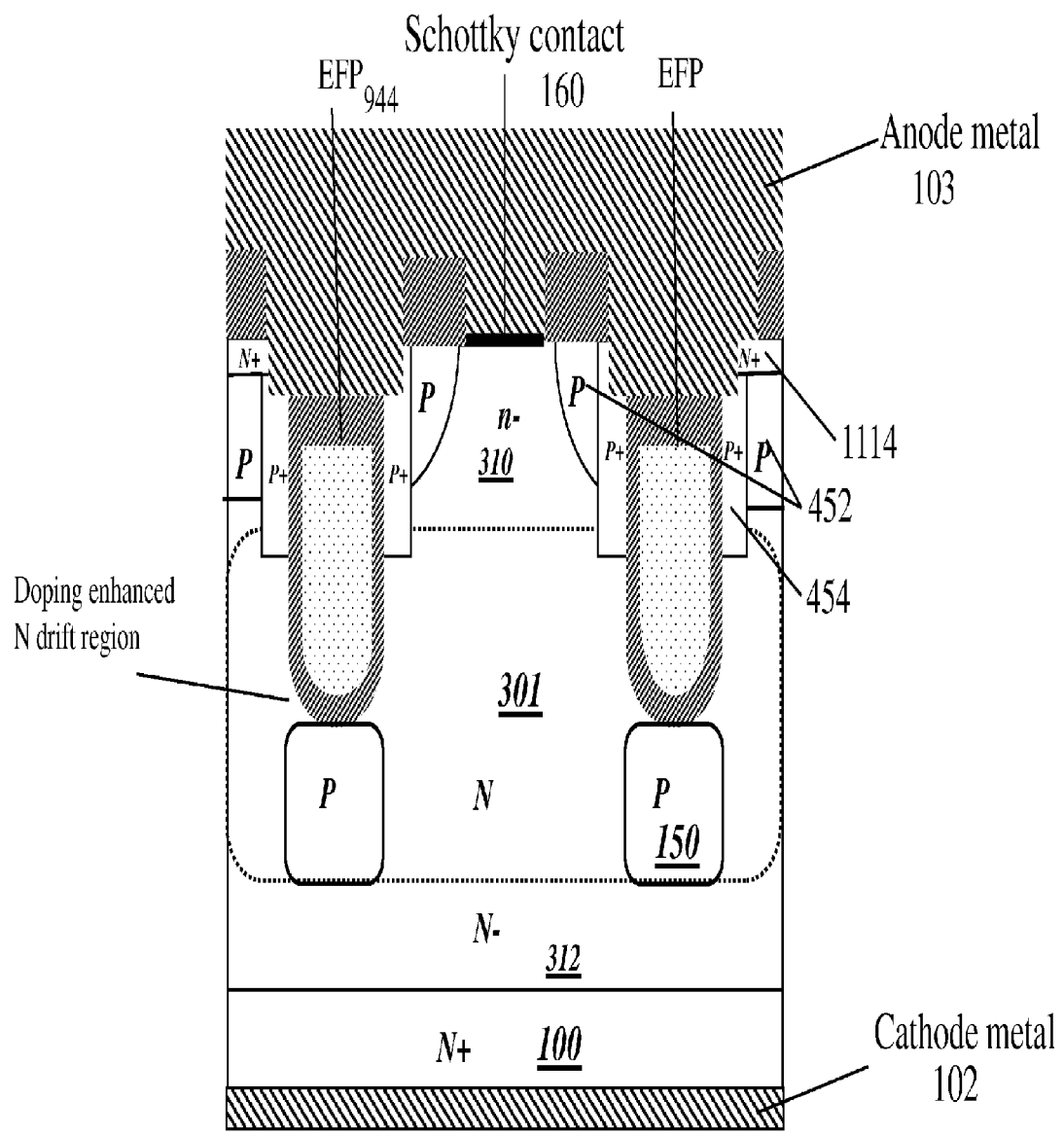
FIG. 11 shows another embodiment of a new Schottky Barrier Diode structure, which has an Embedded Field Plate.

FIG. 11 shows another embodiment of a Schottky Barrier Diode structure which is generally somewhat similar to that shown in FIG. 7, except that an Embedded Field Plate is used instead of the Recessed Field Plate of FIG. 7. Note also that the metal 103 in the recess also makes contact to a shallow n+ diffusion 1114, which provides a source region in active device locations. Note also that the Schottky contact 160 is surrounded by a p-type diffusion 452, which serves as the body region in active device locations. The termination of this p-type diffusion provides a convenient guard ring around the Schottky contact.

Figure 12:
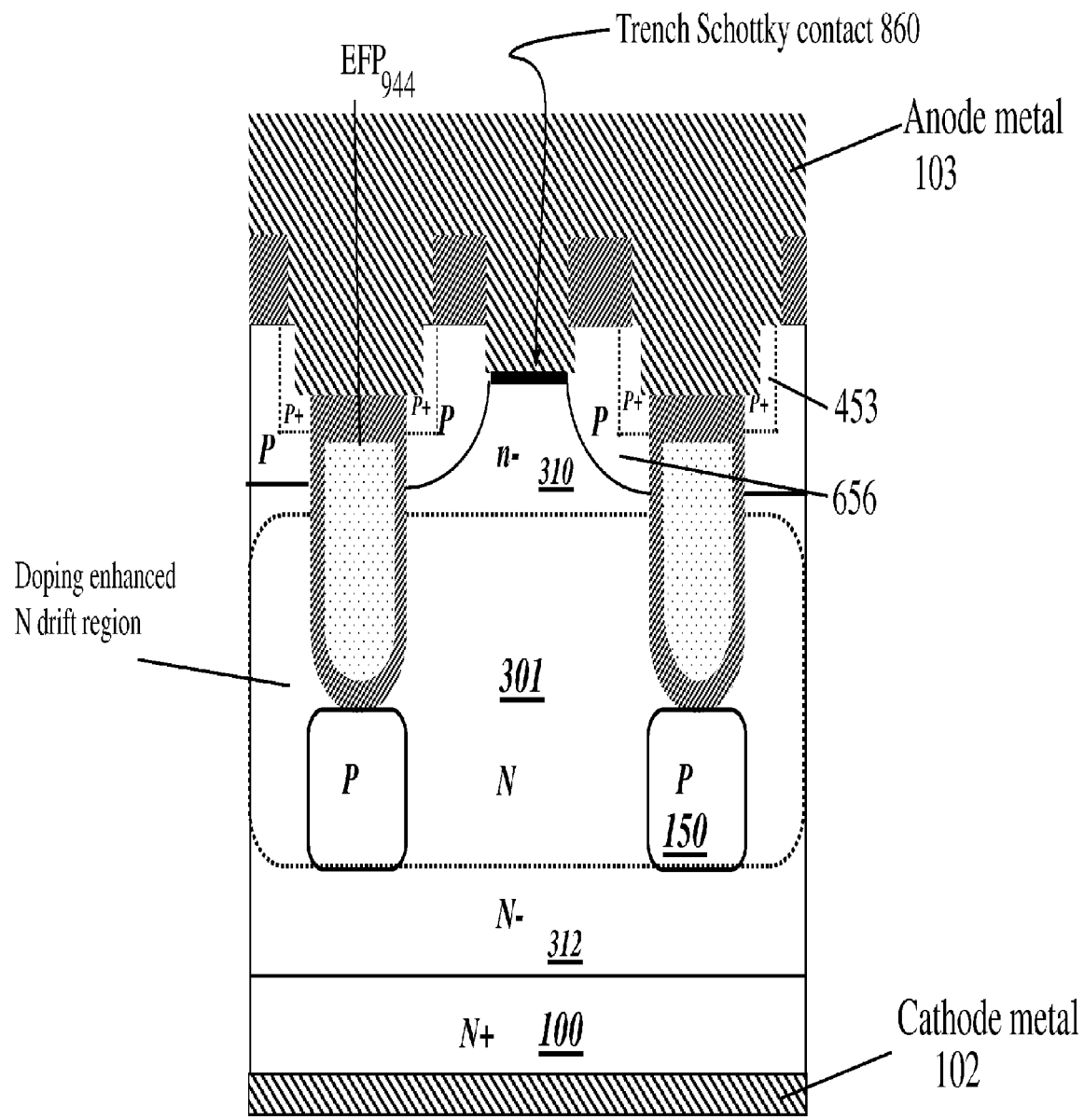
FIG. 12 shows another embodiment of a new Schottky Barrier Diode structure, which has a recessed or trench Schottky barrier contact.

FIG. 12 shows another embodiment of a Schottky Barrier Diode structure which is generally somewhat similar to that shown in FIG. 11, except that it has a recessed or trench Schottky barrier contact 860.

Figure 13A:
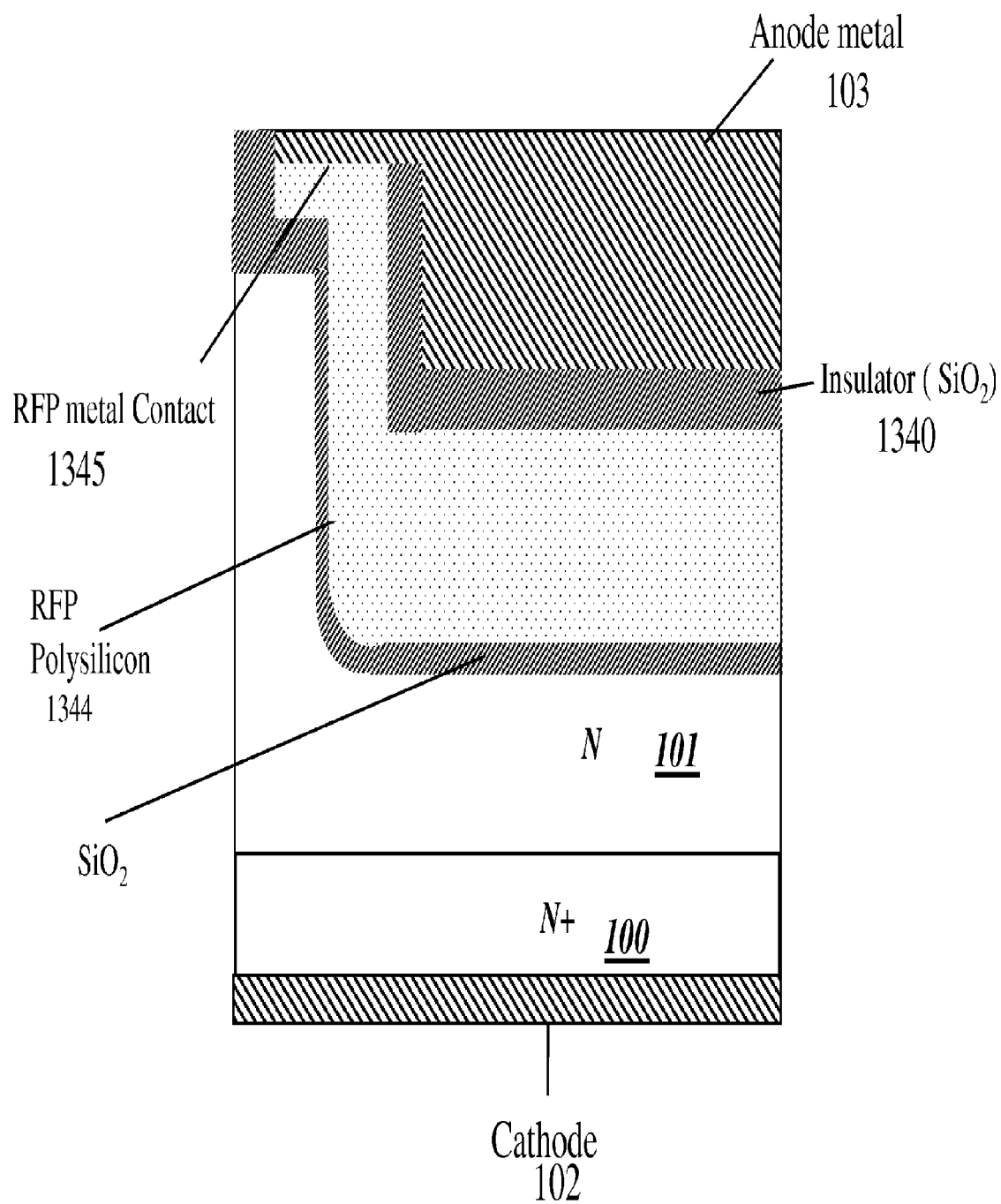
FIGS. 13A-13C show several ways of contacting the conductive field plate layer.
Figure 13B:
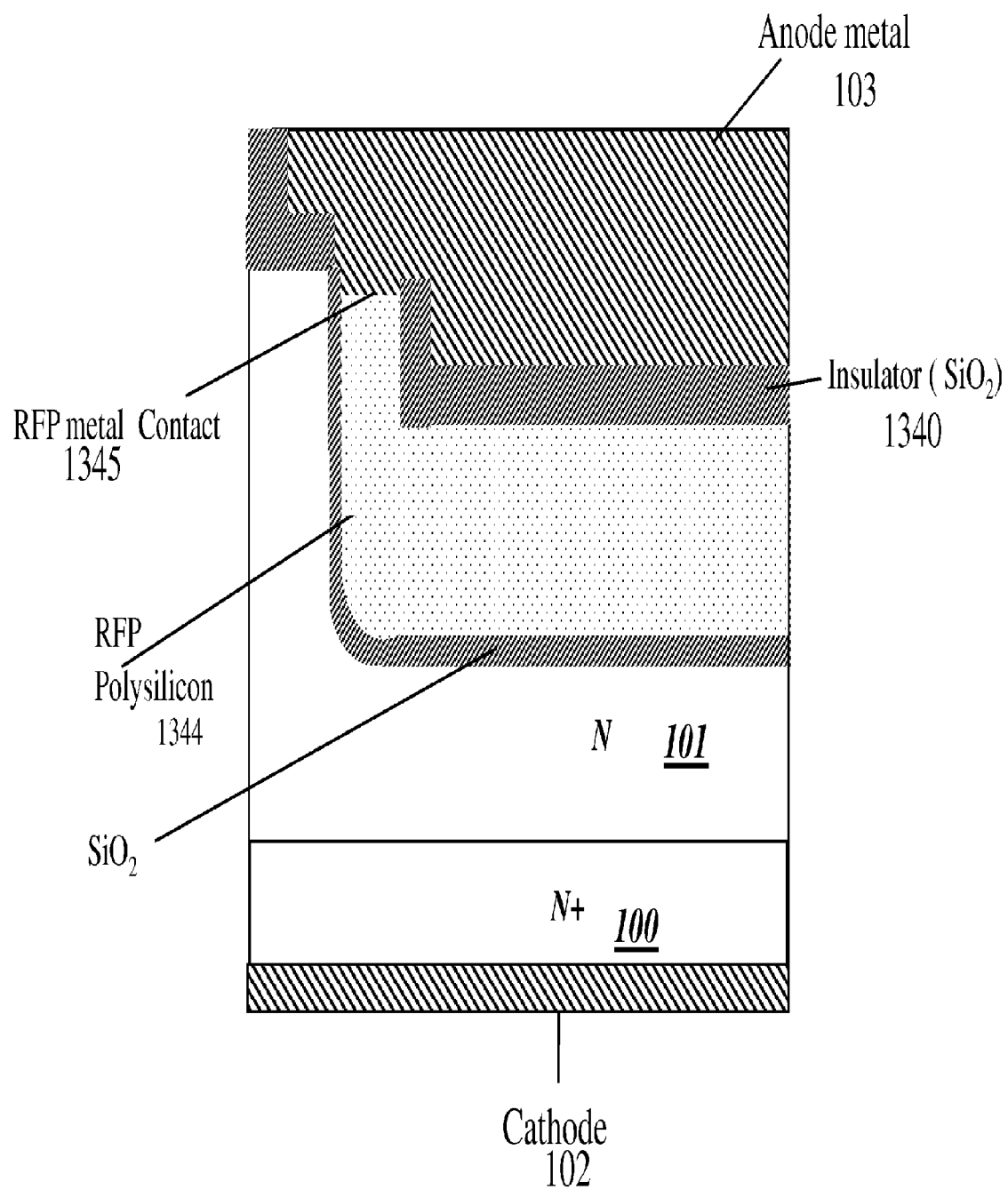
Figure 13C:
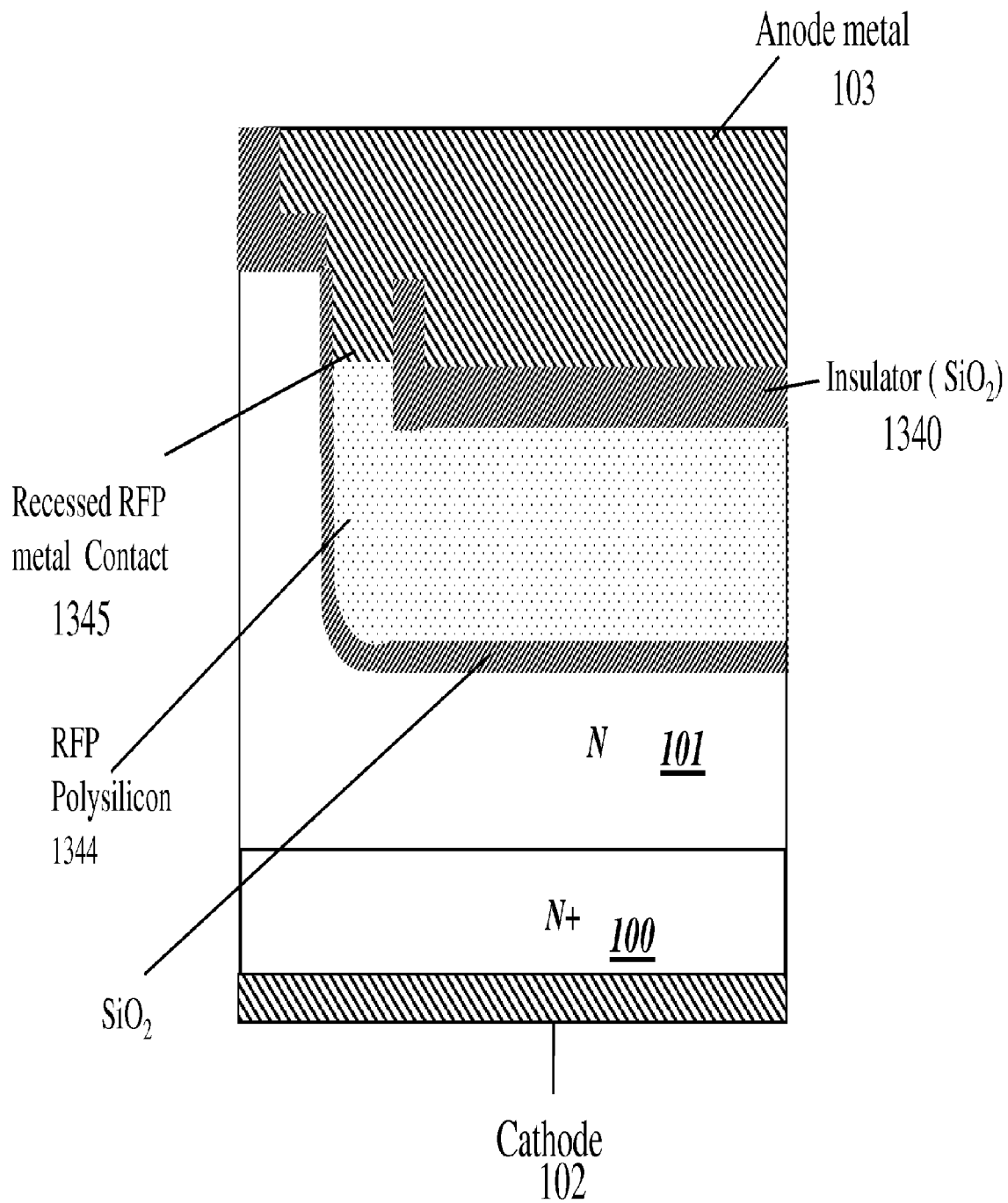

FIGS. 13A-13C show several embodiments of contacting the conductive field plate layer 1344 (which is the same layer which, in other locations, provides the embedded field plates 944) to surface (anode) metal 103. The conductive field plate material 1344 is connected to the anode or source electrode 103 at contact surface 1345, near the upper surface of the metallization, for example as shown in FIG. 13A. Alternatively, the conductive field plate material 1344 and its overlying insulator can be contacted at a lower height, as shown for example in FIG. 13B, or a recessed contact can be made, as shown for example as shown in FIG. 13C.

Figure 14:
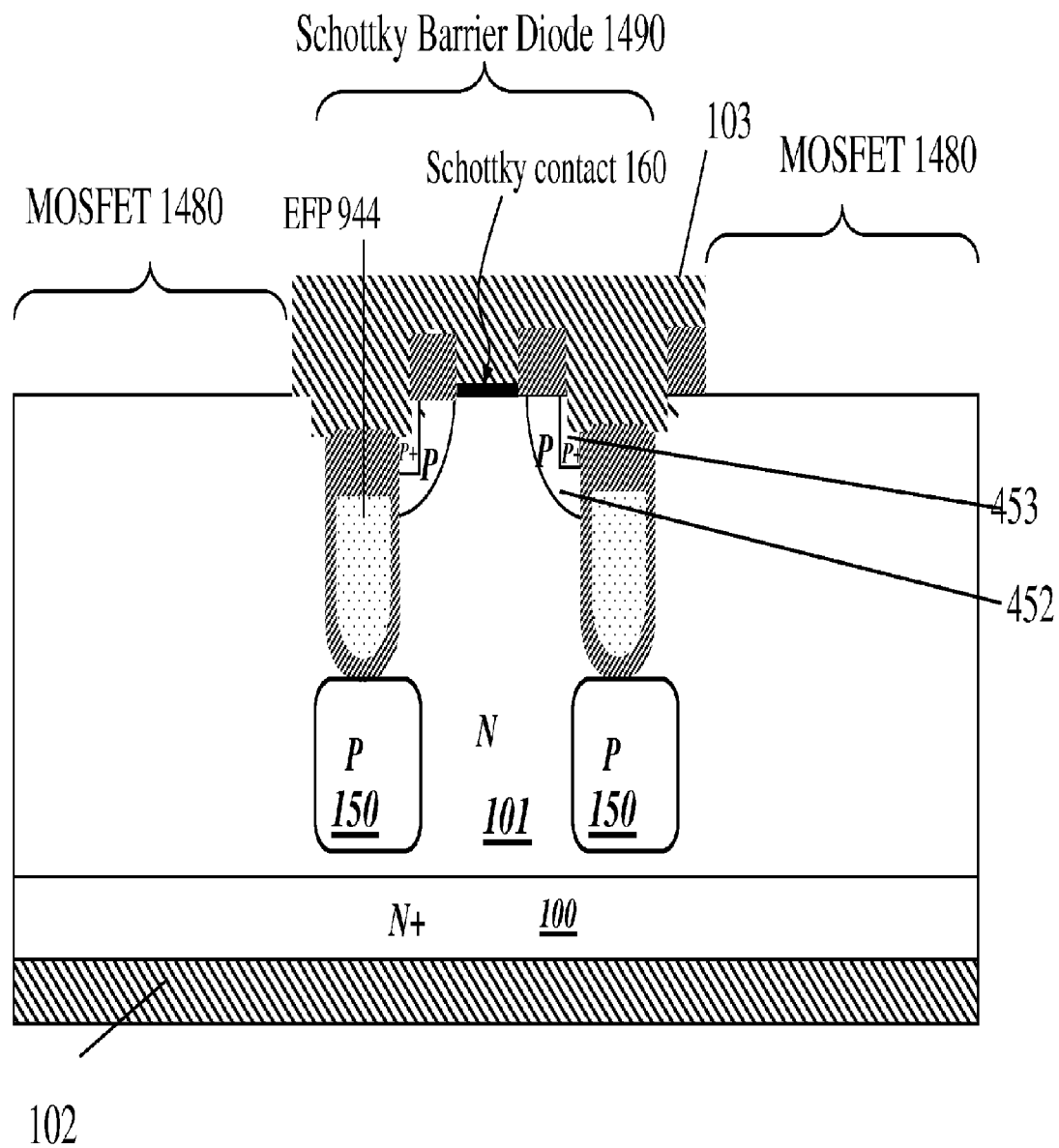
FIG. 14 shows a monolithically integrated MOSFET and Schottky Barrier Diode structure.

FIG. 14 shows a generic implementation of a monolithically integrated MOSFET and Schottky Barrier Diode structure that includes one or more MOSFET sections 1480 adjacent to one or more Schottky Barrier Diode sections 1490. The Schottky Barrier Diode section 1490 can be formed of any embodiment shown in FIGS. 2-12. The MOSFET section 1480 preferably uses a vertical-current-flow trench transistor which includes shield regions below the field plate trenches. (Alternatives are also possible, as discussed below.) This combination provides synergies in structure and fabrication. Some examples of possible transistor structures are shown in FIG. 15A-15G.

Figure 15A:
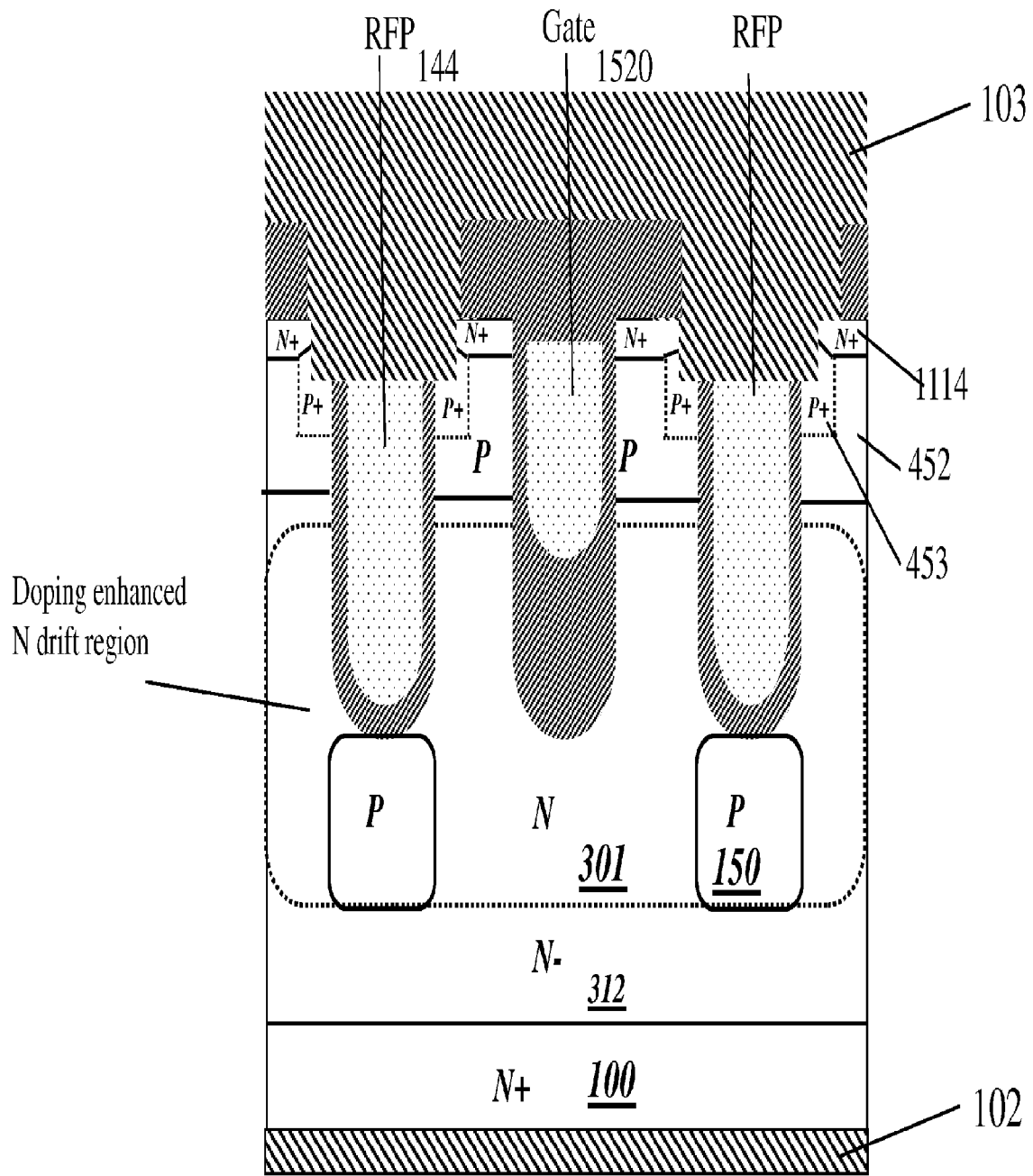
FIGS. 15A-15G show examples of vertical-current-flow transistors which are advantageously integrated with any of the new Schottky barrier diode structures.

FIG. 15A shows an example of a vertical-current-flow transistor which is advantageously integrated with a Schottky diode according to any of FIGS. 2-12. The gate trench (containing gate electrode 1520) is flanked by field-shaping trenches 144 which also provide the lateral confinement for trench Schottky diodes. Thus the deep shield regions 150 provide shaping of the isopotential contours, in the OFF state, which advantageously increases the breakdown voltage for both the transistor structure and the Schottky diode.

Figure 15B:
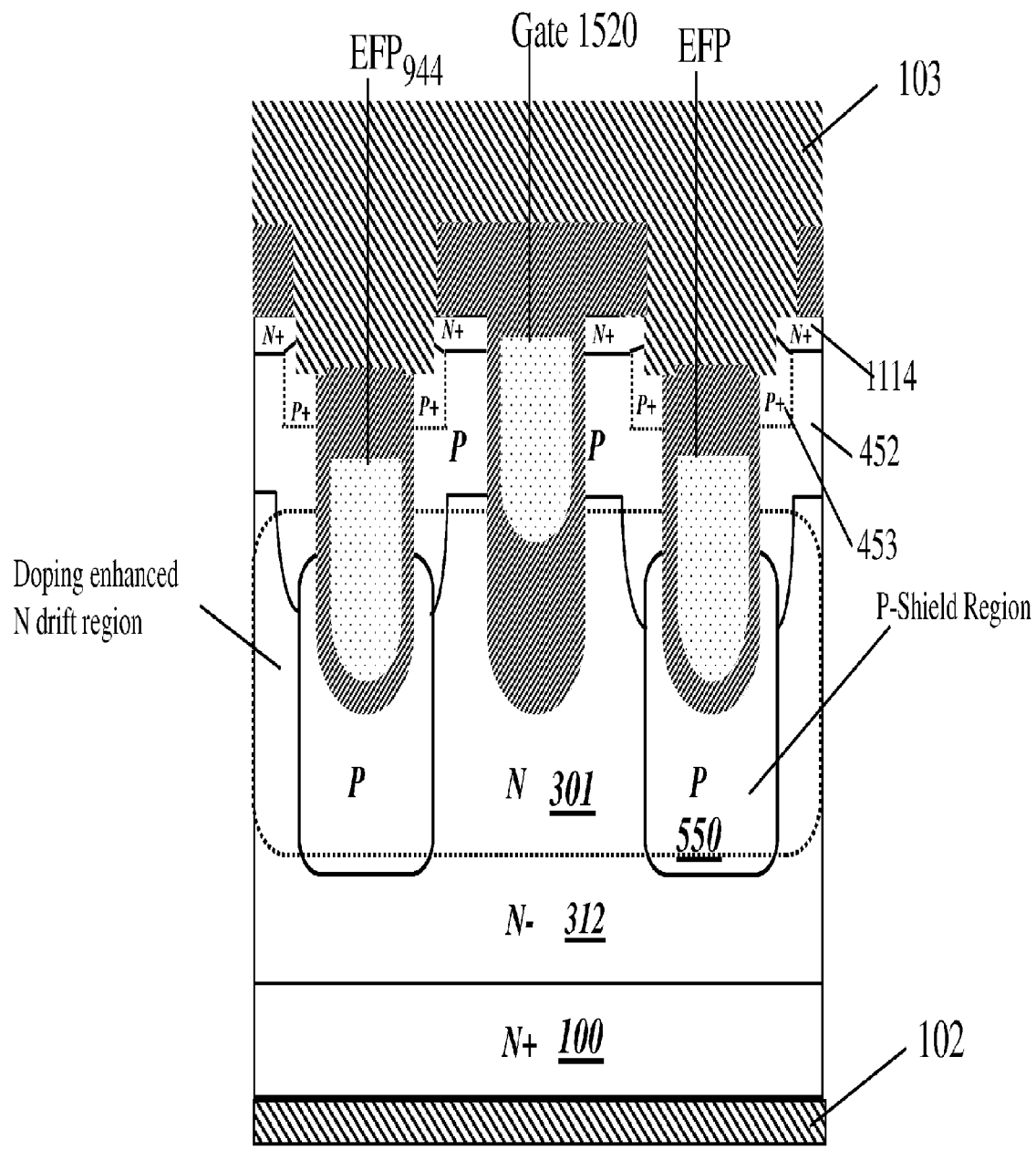

FIG. 15B shows another example of a vertical-current-flow transistor which is advantageously integrated with a Schottky diode according to any of FIGS. 2-12. The gate trench (containing gate electrode 1520) is flanked by EFP trenches which also provide the lateral confinement for trench Schottky diodes. This example uses deep shield regions 550, which include not only portions below the trenches, but also portions laterally adjacent to the trenches. Also, note that the body region extends downward to overlap the deep shield region 550. Thus the deep shield regions 550 provide shaping of the isopotential contours, in the OFF state, which advantageously increases the breakdown voltage for both the transistor structure and the Schottky diode.

Figure 15C:
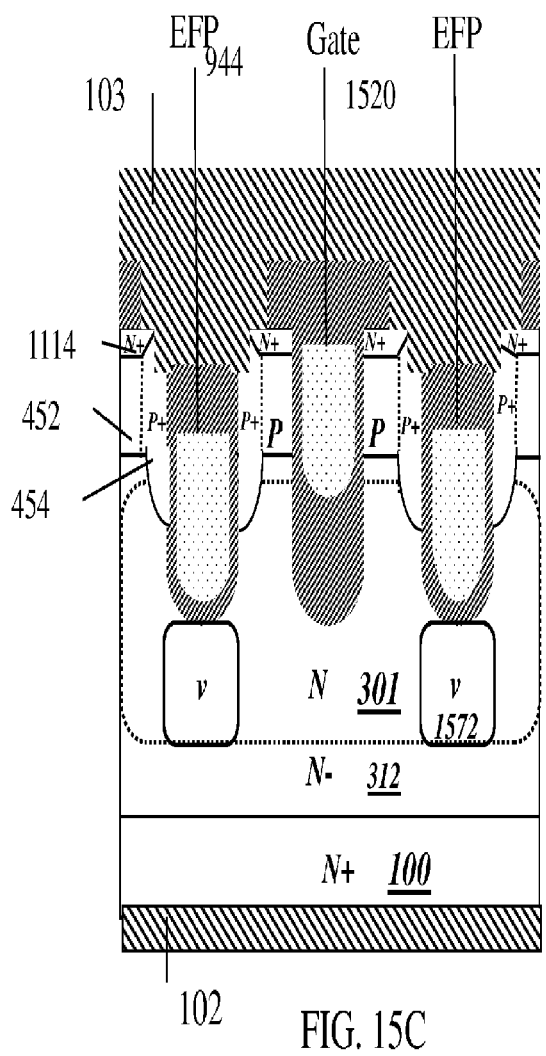

FIG. 15C shows another example of a vertical-current-flow transistor which is advantageously integrated with a Schottky diode according to any of FIGS. 2-12. The gate trench (containing gate electrode 1520) is flanked by RFP trenches which also provide the lateral confinement for trench Schottky diodes. Thus the deep shield regions 1572 provide shaping of the isopotential contours, in the OFF state, which advantageously increases the breakdown voltage for both the transistor structure and the Schottky diode. Note that the deep shield regions, in this example, are near-intrinsic n-type (conventionally indicated by the Greek letter nu).

Figure 15D:
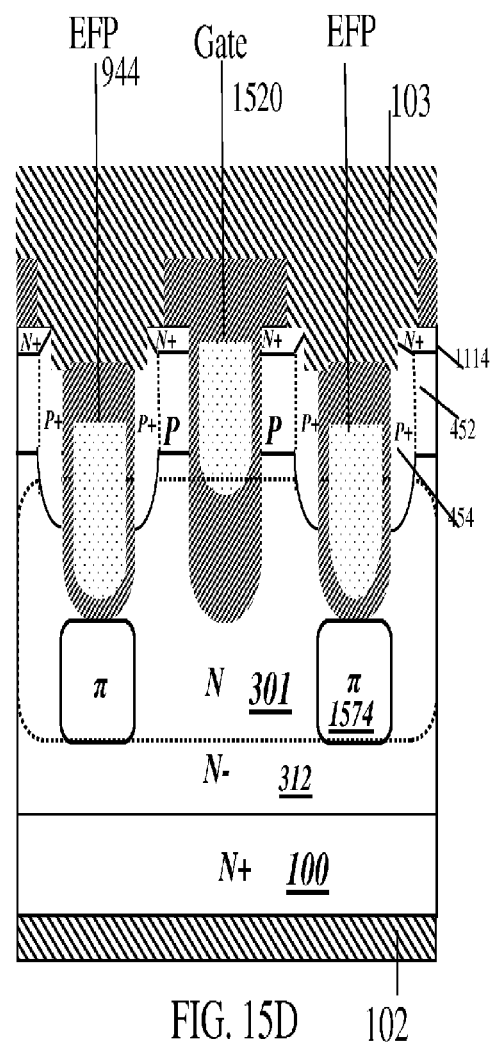

FIG. 15D shows another example of a vertical-current-flow transistor which is advantageously integrated with a Schottky diode according to any of FIGS. 2-12. The gate trench (containing gate electrode 1520) is flanked by RFP trenches which also provide the lateral confinement for trench Schottky diodes. Thus the deep shield regions 1574 provide shaping of the isopotential contours, in the OFF state, which advantageously increases the breakdown voltage for both the transistor structure and the Schottky diode. Note that the deep shield regions 1574, in this example, are near-intrinsic p-type (conventionally indicated by the Greek letter pi).

Figure 15E:
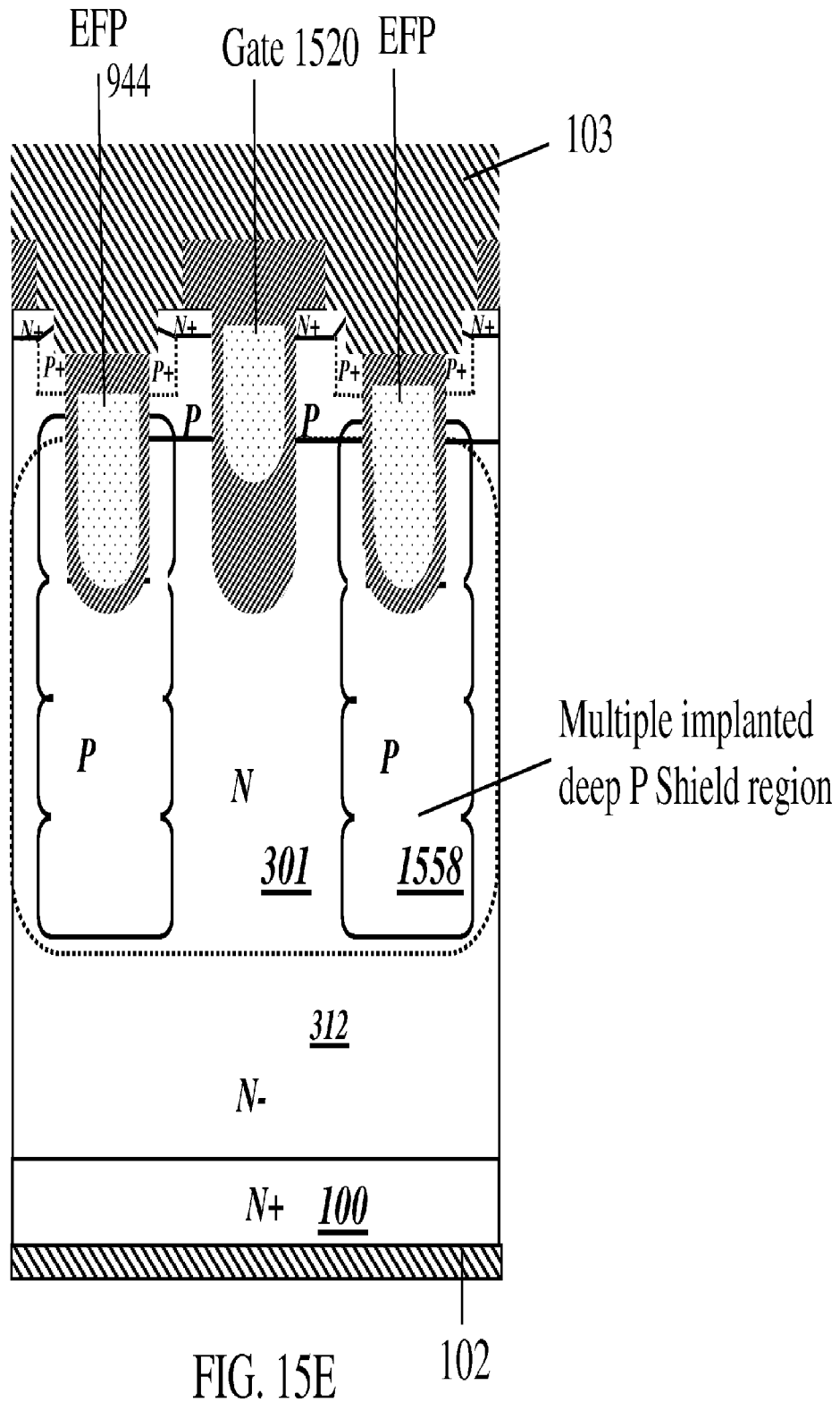

FIG. 15E shows another example of a vertical-current-flow transistor which is advantageously integrated with a Schottky diode according to any of FIGS. 2-12. The gate trench (containing gate electrode 1520) is flanked by RFP trenches which also provide the lateral confinement for trench Schottky diodes. Thus the deep shield regions 1558 provide shaping of the isopotential contours, in the OFF state, which advantageously increases the breakdown voltage for both the transistor structure and the Schottky diode. Note that the deep shield regions 1558, in this example, are formed by multiple implant and drive-in steps, to provide a vertical extent which is greater than the vertical extent of the trench itself. This is particularly advantageous in embodiments which are specified for higher operating voltages (e.g. 100 Volts or more).

Figure 15F:
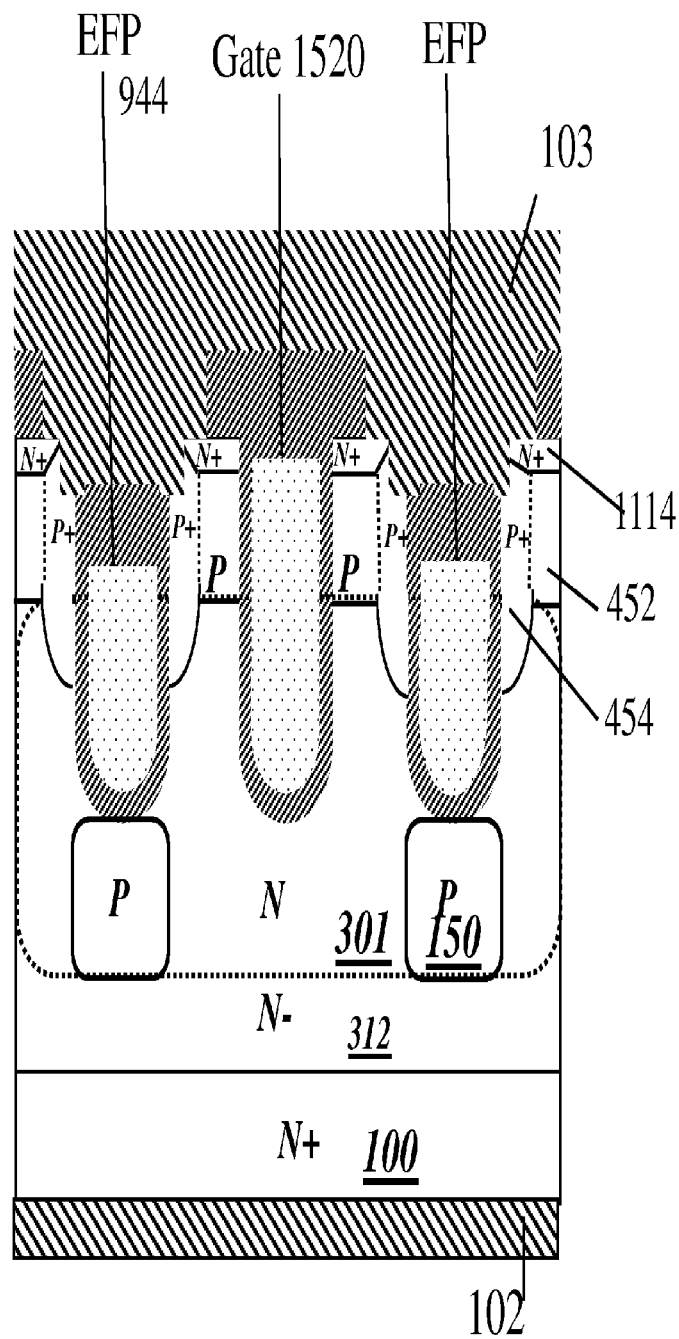

FIG. 15F shows another example of a vertical-current-flow transistor which is advantageously integrated with a Schottky diode according to any of FIGS. 2-12. This example is generally somewhat similar to FIG. 15D, except that the deep shield regions 150 are p-type. The gate trench (containing gate electrode 1520) is flanked by EFP trenches which also provide the lateral confinement for trench Schottky diodes. Thus the deep shield regions 150 provide shaping of the isopotential contours, in the OFF state, which advantageously increases the breakdown voltage for both the transistor structure and the Schottky diode. The deep p+ diffusions extend down below the p-type body diffusion, and will break down before the body is punched through.

Figure 15G:
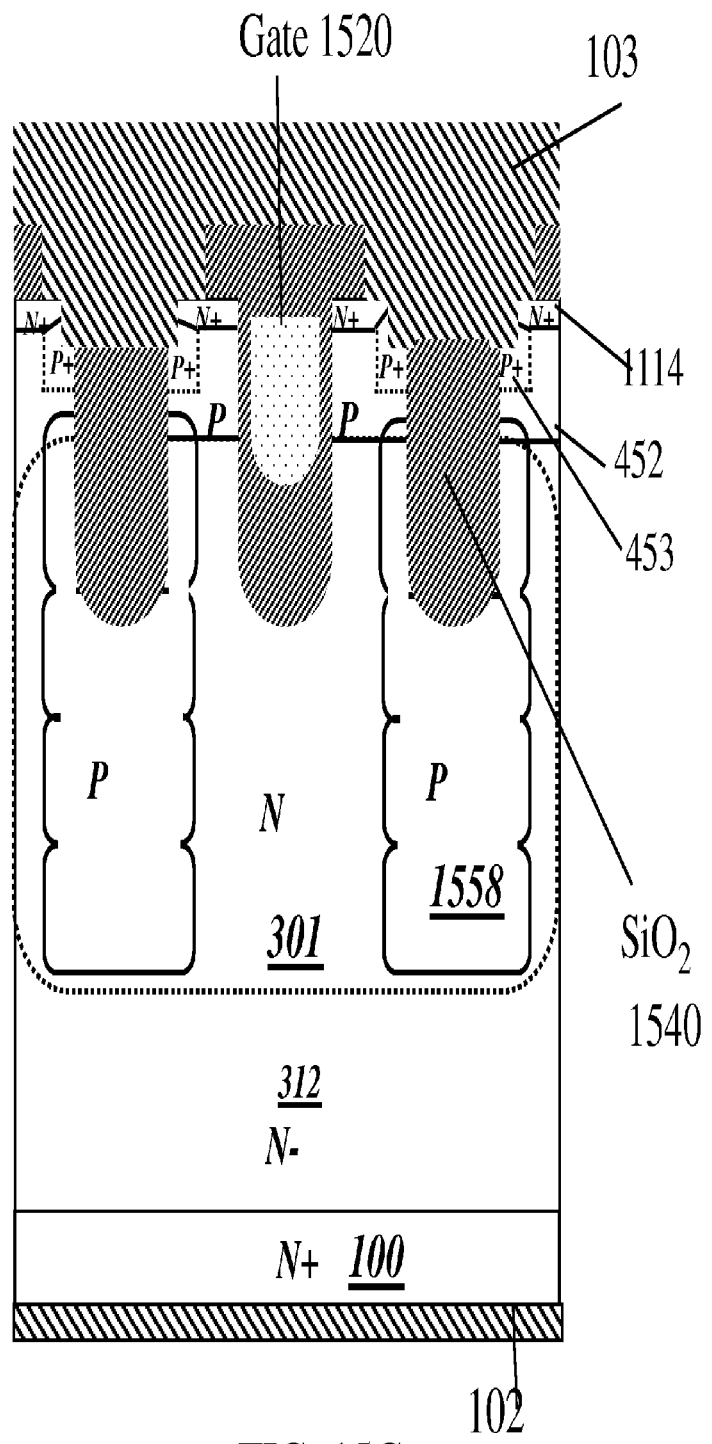

FIG. 15G shows another example of a vertical-current-flow transistor which is advantageously integrated with a Schottky diode according to any of FIGS. 2-12. The gate trench (containing gate electrode 1520) is flanked by dielectric trenches which also provide the lateral confinement for trench Schottky diodes. Thus the deep shield regions provide shaping of the isopotential contours, in the OFF state, which advantageously increases the breakdown voltage for both the transistor structure and the Schottky diode. Note that, in this example, a pure dielectric trench without a field plate is used for the field-shaping trench 141.

FIGS. 16, 17, 18, 19, 20 and 21 show several examples of embodiments that include Schottky Barrier Diode structures such as shown in FIGS. 2-12 integrated with MOSFET structures such as shown in FIGS. 15A-15G.

Figure 16:
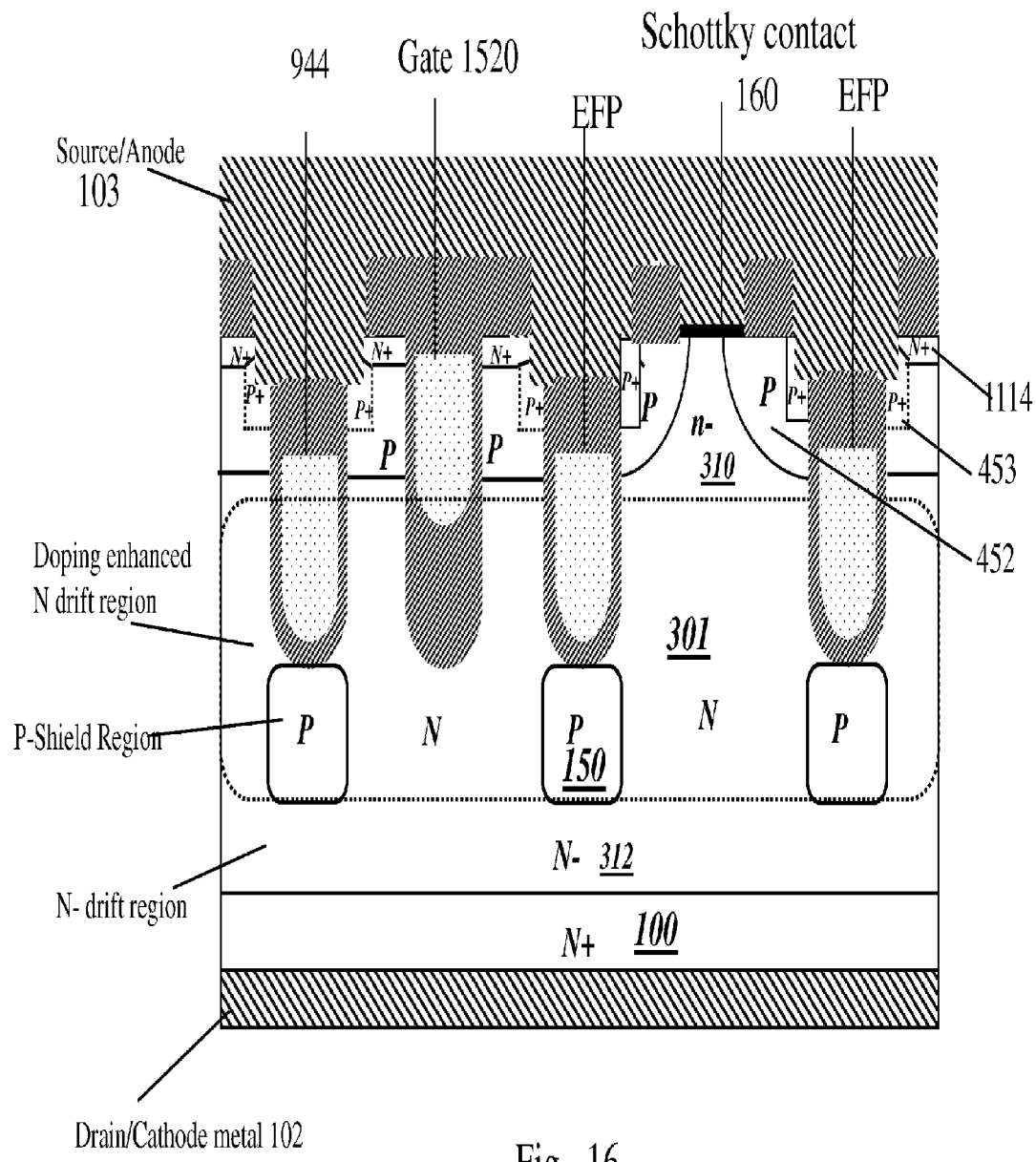
FIGS. 16-21 show several examples of embodiments which include Schottky Barrier Diode structures such as shown in FIGS. 2-12 integrated with MOSFET structures such as shown in FIGS. 15A-15G.

FIG. 16 shows an embodiment of a merged structure in which a trench transistor and a Schottky diode structure share a common field-shaping structure which has been enhanced by a deep shield diffusion component 150. Note that the Schottky contact 160 overlaps with the edge of the body diffusion 452, which provides a p-type guard ring (to avoid geometric enhancement of electric field at the edge of the Schottky contact).

Figure 17:
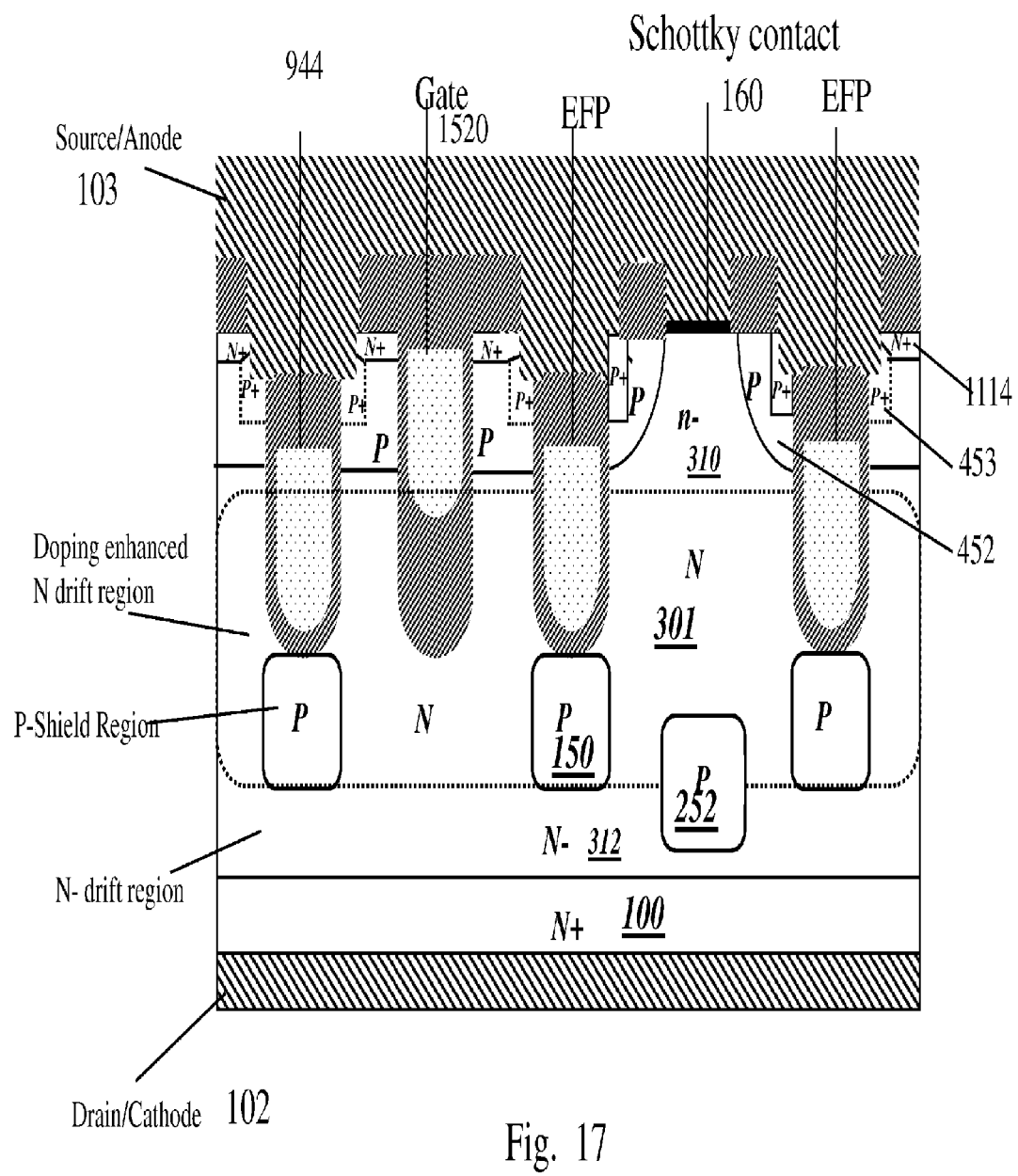

FIG. 17 shows another embodiment of a MOSFET structure integrated with a Schottky Barrier Diode structure which is generally somewhat similar to that shown in FIG. 16, except that it has additional P shield regions 252.

Figure 18:
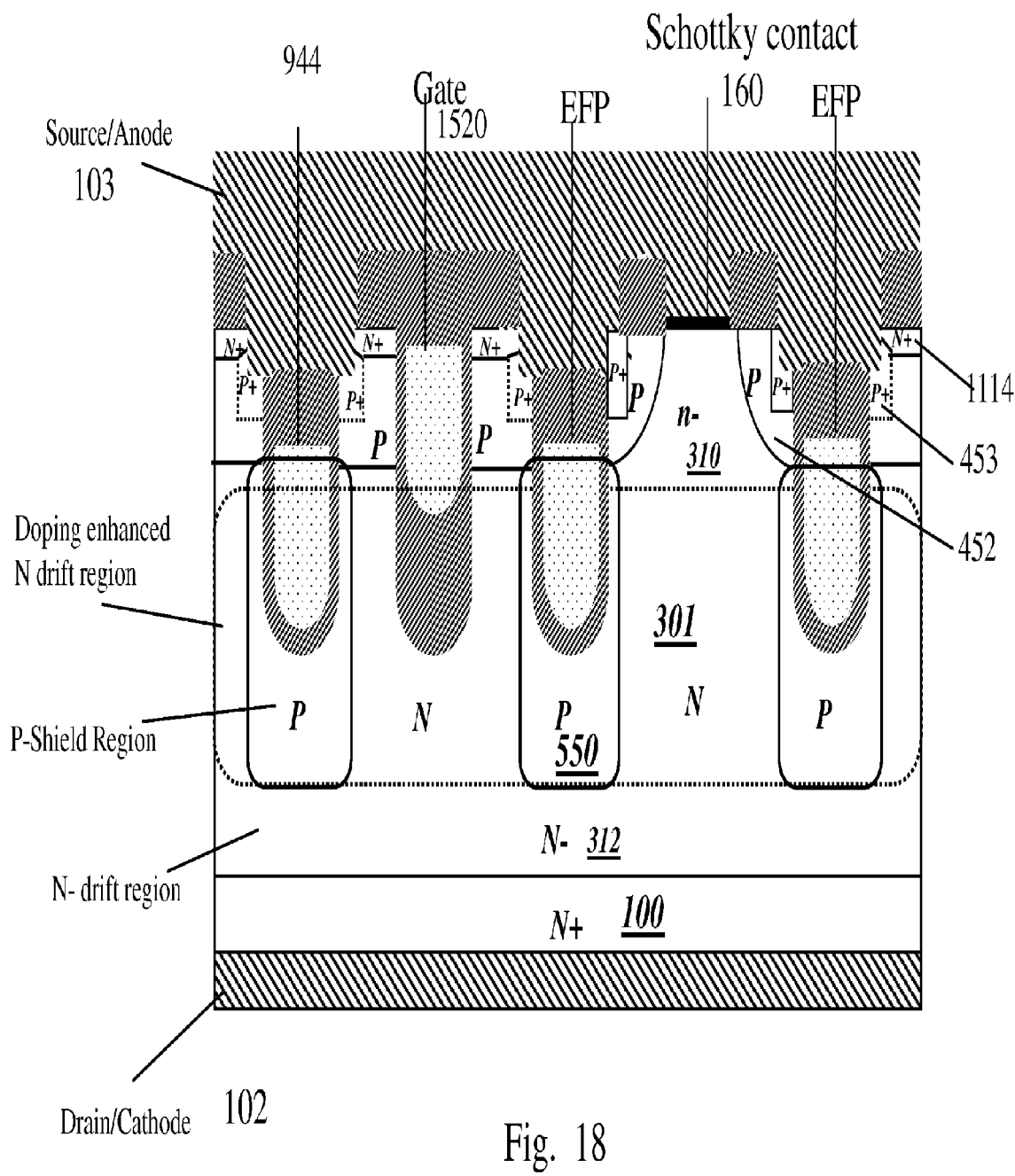

FIG. 18 shows another embodiment of a MOSFET structure integrated with a Schottky Barrier Diode structure which is generally somewhat similar to that shown in FIG. 16, except that it has larger P-shield regions 550 which extend and connect to the P-type body and guard ring diffusion 452.

Figure 19:
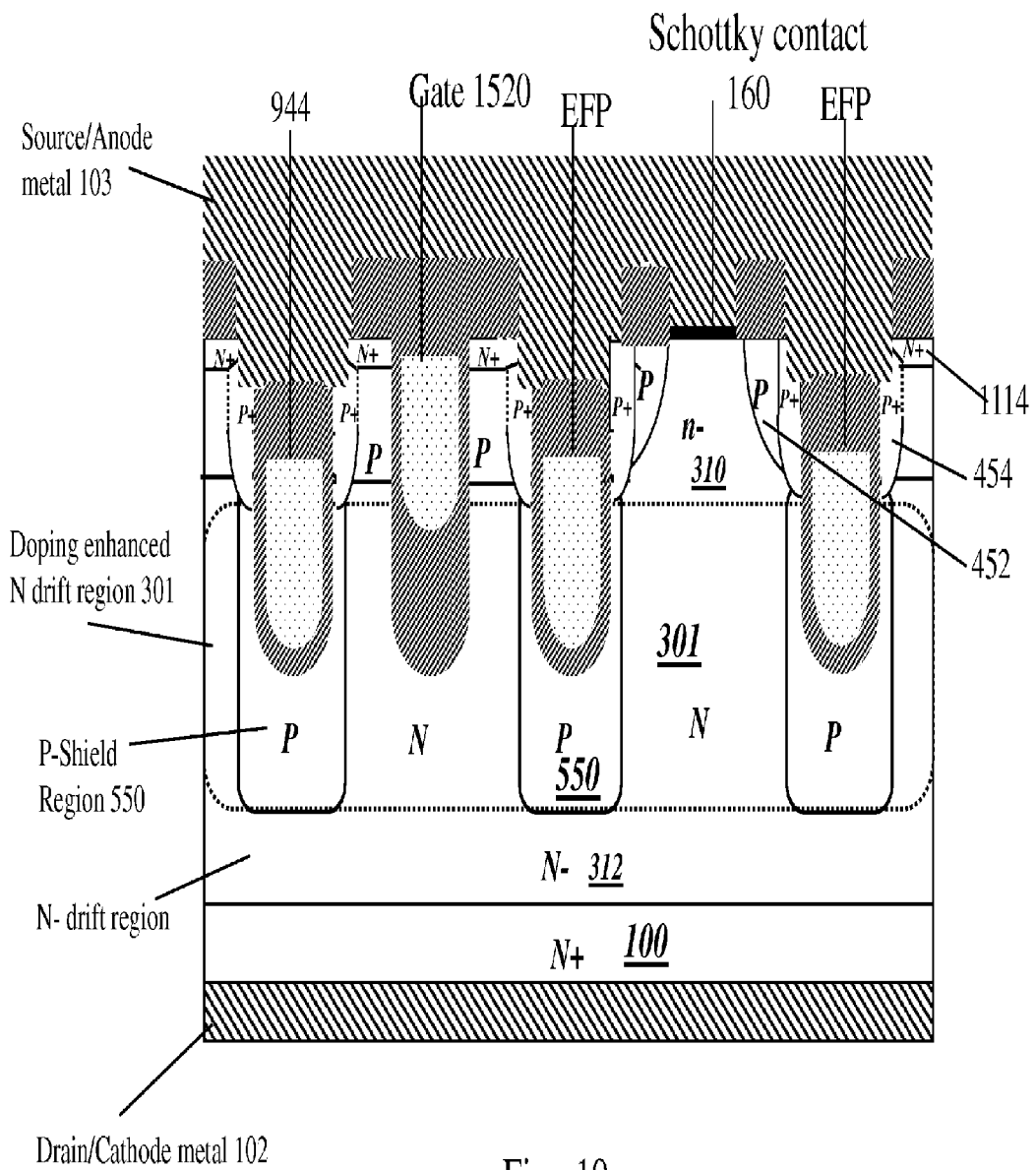

FIG. 19 shows another embodiment of a MOSFET structure integrated with a Schottky Barrier Diode structure which is generally somewhat similar to that shown in FIG. 18, except that it has deep P+ contact regions 454 which contact the P shield regions 550.

Figure 20:
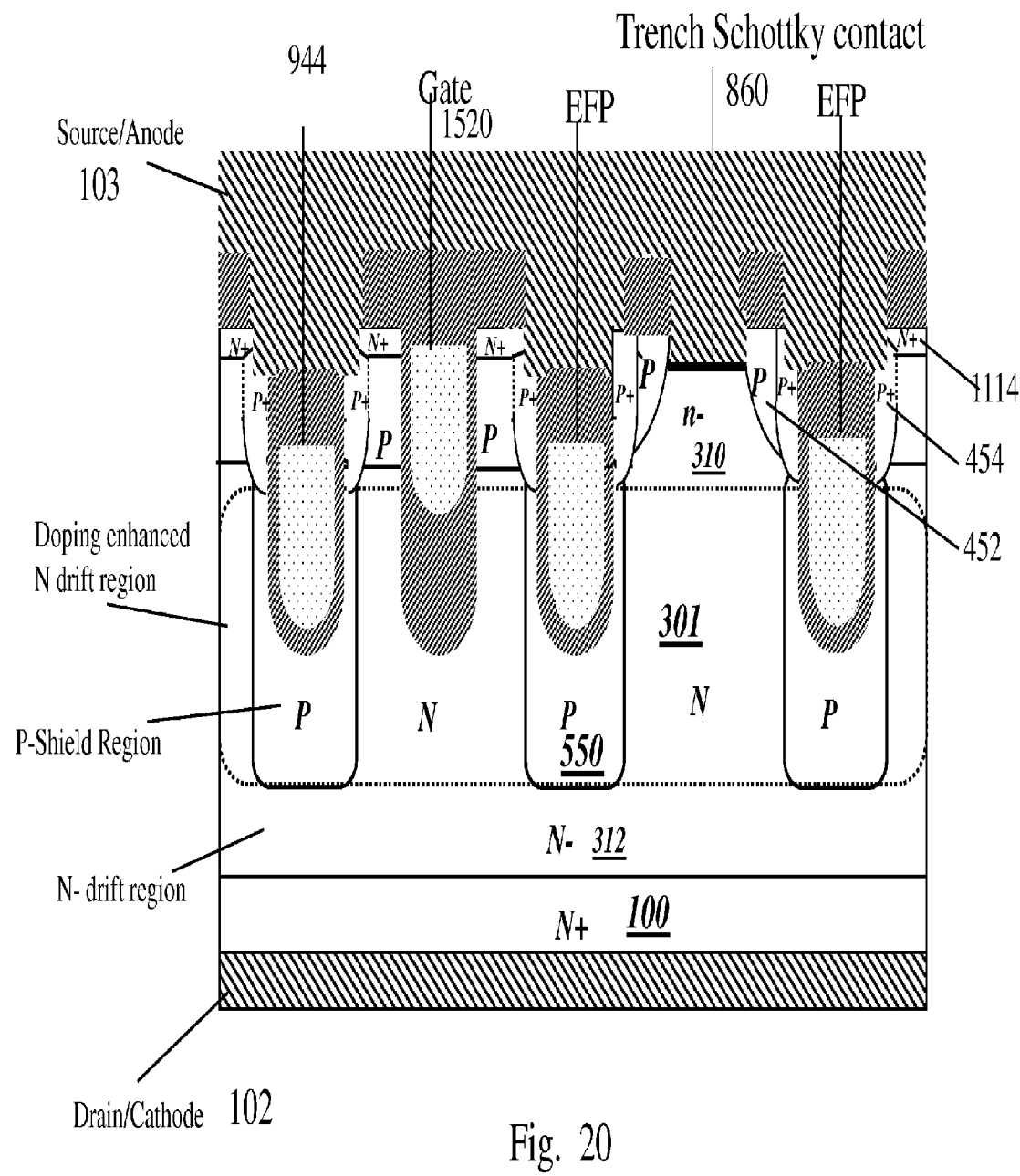

FIG. 20 shows another embodiment of a MOSFET structure integrated with a Schottky Barrier Diode structure which is generally somewhat similar to that shown in FIG. 19, except that it has a recessed trench Schottky contact 860.

Figure 21:
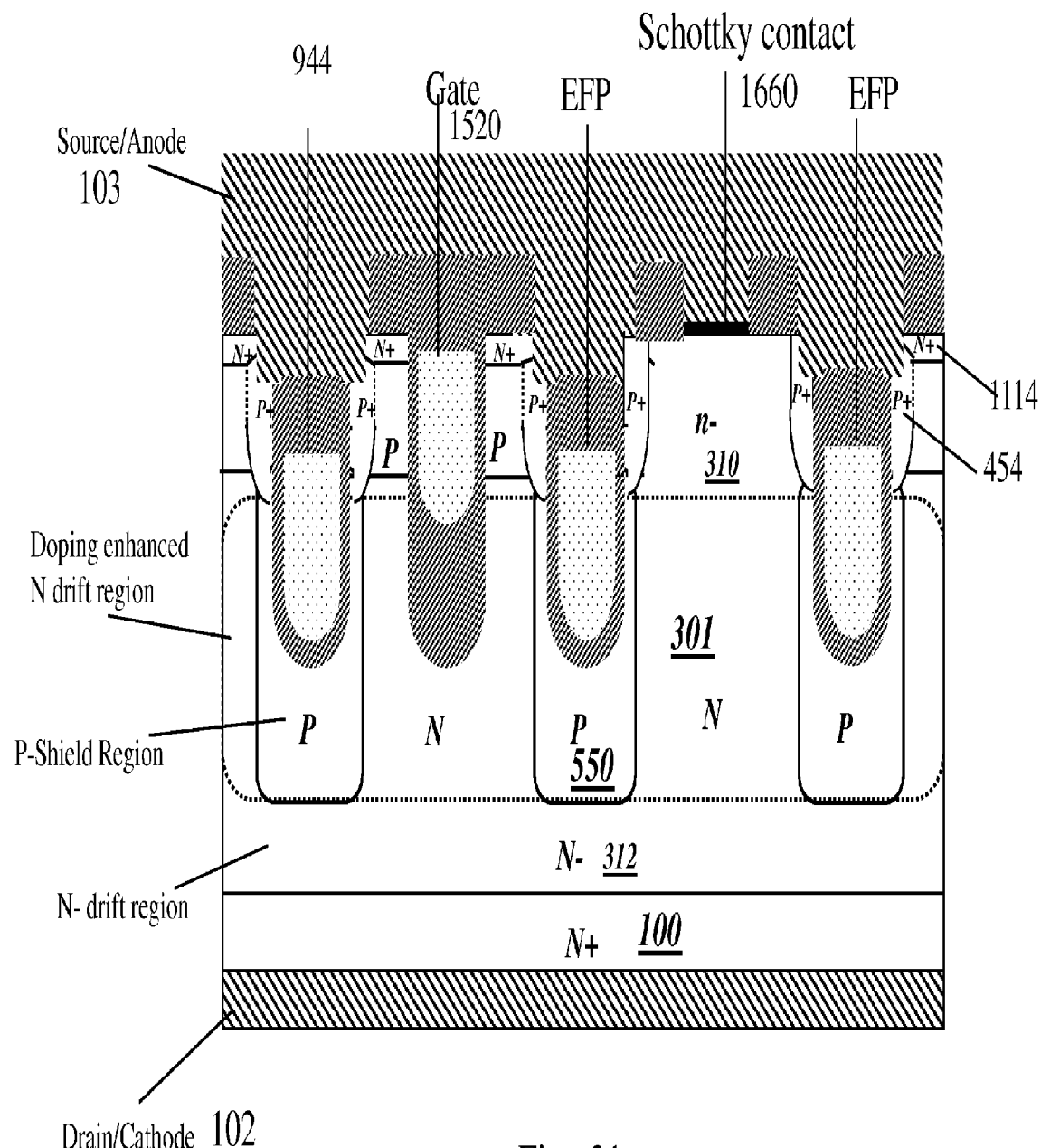

FIG. 21 shows another embodiment of a MOSFET structure integrated with a Schottky Barrier Diode structure which is generally somewhat similar to that shown in FIG. 19, except that diffusion 452 has not been extended to provide a guard ring.

FIG. 22 shows a two-dimensional simulation of isopotential contours of a Schottky barrier diode. The device shown here is generally similar to that of FIG. 3, and has specific parameters as follows: in this example the trench pitch is 1 μm, the thickness of the epitaxial layer ("epi") is 5.5 μm, and the trench depth about 1 μm. The contours shown are drawn at 33.13V, which is the breakdown voltage. (Breakdown will typically start at the bottom of the p-shield.) This simulation assumes that the p-type shield layer 150 is tied to the source potential, so very little voltage drop occurs above the height of this shield layer.

FIG. 23 and FIG. 24 show doping profiles for the device of FIG. 22. Depths are indicated in relation to the epi/substrate boundary, so the bottom of the trench occurs at a depth of about −4.5 μm. Note that these plots do not include the entire thickness of the device, but FIG. 23 shows a profile down the middle of the cell. In this example, the minimum doping value is about $2 \times 10^{15}$ cm$^{-3}$ at about 1.1 micron depth. (This is less than the epi background doping, and reflects some degree of counterdoping from the p-type shield regions 150.) Above that depth, the peak doping is about $1.8 \times 10^{16}$ cm$^{-3}$, which reflects the contribution of the n-type enhancement layer 310.

FIG. 24 shows a profile for the same device, about 100 nm laterally spaced from the vertical sidewall of the trench. In this example, two junctions are visible, at about −3.9 μm depth and at about −4.2 μm depth. The distance between these junctions shows the thickness of the p-type shield region 150 at this location. Along the line of this profile the peak doping concentration in the shield region 150 is only about $5 \times 10^{15}$ cm$^{-3}$, but of course the peak doping concentration can be higher at the center of the shield region.

Note also, in the profiles of FIGS. 23 and 24, that some degree of vertical gradation is common. For example, updiffusion of donor atoms from the substrate provides an additional component of doping near the bottom of the epitaxial layer.

According to some (but not necessarily all) disclosed embodiments, there is provided: A semiconductor device, comprising: trench transistors, each including at least an n-type semiconductor source region and a p-type semiconductor body region defining a junction therebetween; trench diodes, each including a Schottky barrier where a metallic material touches an n-type semiconductor anode region without making ohmic contact; one or more semiconductor drift regions, lying at least partially below said body regions and/or said anode regions; isolation trenches; shield diffusions lying at least partly beneath said isolation trenches; wherein at least some ones of said isolation trenches adjoin both a trench transistor and a trench diode; wherein ones of said drift regions have a higher net n-type doping at depths near the bottom depth of said isolation trenches than at depths nearer said body region; and wherein said shield diffusions shape depletion contours, when said transistors are off, to thereby reduce electric field at said Schottky barrier, and also at said junction between said source region and said body region.

According to some (but not necessarily all) disclosed embodiments, there is provided: A semiconductor device, comprising: trench transistors, each including at least an n-type semiconductor source region and a p-type semiconductor body region defining a junction therebetween; trench diodes, each including a Schottky barrier where a metallic material touches an n-type semiconductor anode region without making ohmic contact, and a p-type guard ring which laterally abuts said Schottky barrier; one or more semiconductor drift regions, lying at least partially below said body regions and/or said anode regions; isolation trenches; shield diffusions lying at least partly beneath said isolation trenches; wherein at least some ones of said isolation trenches adjoin both a trench transistor and a trench diode; wherein said p-type guard ring corresponds to a lateral edge of the same population of dopants as those which form said p-type semiconductor body region; and wherein said shield diffusions shape depletion contours, when said transistors are off, to thereby reduce electric field at said Schottky barrier, and also at said junction between said source region and said body region.

According to some (but not necessarily all) disclosed embodiments, there is provided: A semiconductor device, comprising: trench transistors, each including at least a semiconductor source region and a semiconductor body region defining a junction therebetween; trench diodes, each including a Schottky barrier; isolation trenches; deep shield diffusions lying at least partly beneath said isolation trenches; wherein at least some ones of said isolation trenches adjoin both a trench transistor and a trench diode; and wherein said shield diffusions shape depletion contours, when said transistors are off, to thereby reduce electric field at said Schottky barrier, and also at said junction between said source region and said body region.

According to some (but not necessarily all) disclosed embodiments, there is provided: A semiconductor device, comprising: first trenches containing gate electrodes; second trenches including field plates, and not gate electrodes; a first semiconductor mesa containing an n-type source region, a p-type body region, and an n-type drift region; wherein at least some ones of said gate electrodes are capacitively coupled to selectably invert at least some portions of said body regions; a second semiconductor mesa containing a metallic substance which forms a Schottky barrier contact to at least part of an n-type anode region, a p-type guard region which laterally adjoins said anode region, and an n-type drift region which lies beneath said anode region; deep p-type shield diffusions lying within said drift region, and at least partly beneath said isolation trenches; and an additional n-type doping component, within said drift regions below the depth of said body region; whereby said shield diffusions shape depletion contours, when said transistors are off, to thereby reduce electric field at said Schottky barrier.

According to some (but not necessarily all) disclosed embodiments, there is provided: A method for fabricating a merged device which includes both Schottky barrier diodes and vertical-current-flow active devices, comprising the actions, in any order, of: forming gate trenches in first semiconductor mesa locations, Schottky barriers in second semiconductor mesa locations, and isolation trenches which separate at least some ones of said first semiconductor mesa locations from adjacent ones of said second semiconductor mesa locations; wherein said at least some ones of said gate trenches are flanked by ones of said isolation trenches; forming n+ source regions in proximity to said gate trenches; and introducing acceptor dopants to simultaneously form both p-type body regions which laterally abut said gate trenches, and p-type guard rings which laterally abut said Schottky barriers in said second semiconductor mesa locations.

According to some (but not necessarily all) disclosed embodiments, there is provided: A semiconductor device, comprising: a Schottky barrier metal overlying a mesa of semiconductor material which is doped to less than $10^{17}$ cm$^{-3}$ n-type; a p-type guard ring, in said semiconductor material, which laterally surrounds the area of contact between said Schottky barrier metal and said semiconductor material; at least one isolation trench, flanking said mesa, which has an approximately constant potential; an additional n-type diffusion component, at intermediate depths within said mesa, which reduces the resistivity of said semiconductor at intermediate depths to less than the resistivity of said semiconductor material near said area of contact; and at least one p-type shield diffusion, lying at least partly below the bottom of said trench; whereby said p-type diffusion, in combination with said trench, shapes isopotential contours to provide an increased breakdown voltage.

According to some (but not necessarily all) disclosed embodiments, there is provided: A method of operating a power semiconductor device, comprising: in the ON state, passing electrons from an n-type semiconductor source, through a channel portion of a p-type semiconductor body region which has been inverted by the applied voltage on a gate electrode, into an n-type semiconductor drift region and thence to an n-type drain which is more positive than said source; in the OFF state, if said source is more positive than said drain, then passing electrons from said drift region through a Schottky barrier to a metal which is ohmically connected to said source; wherein said Schottky barrier is separated from said channel portion by at least one isolation trench having an additional concentration of acceptor dopants beneath it; and in the OFF state, if said drain is more positive than said source, then blocking conduction at said channel portion and said Schottky barrier, while the electric field magnitudes at the locations of said channel portion and of said Schottky barrier are both reduced by isopotential contour shaping due to said additional concentration of acceptor dopants.

According to some (but not necessarily all) disclosed embodiments, there is provided: A semiconductor device, comprising: trench transistors, each including at least an n-type semiconductor source region and a p-type semiconductor body region defining a junction therebetween; trench diodes, each including a Schottky barrier where a metallic material touches an n-type semiconductor anode region without making ohmic contact; a termination region, containing at least some n-type intrinsically doped epitaxial semiconductor material, surrounding said trench transistors and trench diodes; one or more semiconductor drift regions, lying at least partially below said body regions and/or said anode regions; isolation trenches; shield diffusions lying at least partly beneath said isolation trenches; wherein at least some ones of said isolation trenches adjoin both a trench transistor and a trench diode; wherein ones of said drift regions have a higher net n-type doping at depths near the bottom depth of said isolation trenches, than the doping of said n-type intrinsically doped epitaxial semiconductor material; and wherein said shield diffusions shape depletion contours, when said transistors are off, to thereby reduce electric field at said Schottky barrier, and also at said junction between said source region and said body region.

According to some (but not necessarily all) disclosed embodiments, there is provided: Power devices which include trench Schottky barrier diodes and also (preferably) trench-gate transistors. Isolation trenches flank both the gate regions and the diode mesas, and have an additional diffusion below the bottom of the isolation trenches. The additional diffusion helps to shape isopotential contours when the device is in the OFF state, thus reducing the electric field (and leakage) at both the Schottky barrier and at the body diode.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Numerous other embodiments in this invention can be demonstrated by using different combinations of the above Schottky Barrier Diode and MOSFET structures. Furthermore, in such integrated structures, the MOSFET and Schottky diode cell structures should preferably be consistent in terms of features such as the P-shield, N− doping enhancement layers and recessed or embedded field plates.

Furthermore, all the above variants of the structures can be realized in stripe or cellular layout such as square, rectangular, hexagonal or circular layouts.

In another embodiment the ratio between the number of MOSFET cells and Schottky diode cells is different. For example the number of rows of MOSFETs is higher than those of Schottky diodes in the stripe layout version as well as having different numbers of MOSFET and Schottky diode cells in the cellular version.

In another embodiment the cell pitch of the MOSFET cells and Schottky barrier diode cells are different. For example, the mesa width, trench width or both can be different.

The diode structure described can also be used in structures which are not merged, e.g. Schottky Barrier Diode structures which do have a deep shield can optionally (and less preferably) be used in combination with transistors which do not have the deep shield region in their field-shaping trenches.

For another example, the disclosed innovations can also be applied to structures which also contain p-channel devices, in which holes are the majority carriers.

For another example, the examples described above are implemented in silicon; but in alternative embodiments, the disclosed innovations can also be implemented in other semiconductors such Ge, SiGe, GaAs or other III-V compound semiconductors (including ternary and quaternary alloys), SiC or other Group IV semiconducting alloys, etc. etc.

In other contemplated embodiments, various doped regions can have graded dopant concentrations.

In various other embodiments, a wide variety of other semiconductor regions and connections can be added if desired.

By varying device parameters, as will be readily understood by persons of ordinary skill in the art, the Schottky Barrier Diode and SBD+MOSFET structures can be optimized for Voltages from 20V (or less) up to 600 V (or more).

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following US patent applications. All of these applications have at least some common ownership, copendency, and inventorship with the present application. All of these applications, and all of their priority applications, are hereby incorporated by reference: US20080073707, US20080191307, US20080164516, US20080164518, US20080164520, US20080166845, US20090206924, US20090206913, US20090294892, US20090309156, US20100013552, US20100025726, US20100025763, US20100084704, US20100219462, US20100219468, US20100214016, US20100308400, US20100327344, US20110006361, US20110039384, US20110079843, and U.S. application Ser. Nos. 12/369,385; 12/431,852; 12/720,856; 12/806,203; 12/834,573; 12/835,636; 12/887,303; 12/939,154; 13/004,054; and 13/089,326. Applicants reserve the right to claim priority from these applications, directly or indirectly, and therethrough to even earlier applications, in all countries where such priority can be claimed.

Further background, and indications of variations which will be immediately understood by persons of ordinary skill in the art, can be found in B. Baliga, Modern Power Devices (1992); B. Baliga, Fundamentals of Power Semiconductor Devices (2008); and all of the annual proceedings of the ISPSD symposia; all of which are hereby incorporated by reference.

The claims as filed are intended to be as comprehensive as possible, and NO subject matter is intentionally relinquished, dedicated, or abandoned.

What is claimed is:

1. A semiconductor device, comprising:
   first trenches containing gate electrodes;
   second trenches including field plates, and not gate electrodes;
   a first semiconductor mesa containing
      an n-type source region,
      a p-type body region, and
      an n-type drift region;
      wherein at least some ones of said gate electrodes are capacitively coupled to selectably invert at least some portions of said body regions;
   a second semiconductor mesa containing
      a metallic substance which forms a Schottky barrier contact to at least part of an n-type anode region,
      a p-type guard region which laterally adjoins said anode region, and
      an n-type drift region which lies beneath said anode region;
   deep p-type shield diffusions lying within said drift region, and at least partly beneath said trenches; and
   an additional n-type doping component, within said drift regions below the depth of said body region;
   whereby said shield diffusions reduce electric field at said Schottky barrier, and also at said junction between said source region and said body region.

2. The semiconductor device of claim 1, wherein said Schottky barrier is provided by a contact between silicon and a metal silicide.

3. The semiconductor device of claim 1, wherein said Schottky barrier is provided by a contact between a metallic substance and a semiconductor which is doped to less than $10^{17}$ cm$^{-3}$.

4. The semiconductor device of claim 1, wherein said shield diffusions have a minimum net doping concentration of less than $10^{16}$ cm$^{-3}$.

5. The semiconductor device of claim 1, wherein said Schottky barrier is provided by a contact between platinum or titanium silicide and silicon, and is laterally surrounded by a p-type guard ring.

6. The semiconductor device of claim 1, wherein said shield diffusions have a maximum net doping concentration of more than $10^{17}$ cm$^{-3}$ p-type.

7. The semiconductor device of claim 1, wherein said source, body, drift, and drain regions all consist essentially of silicon.

8. The semiconductor device of claim 1, further comprising a frontside metallization which is electrically connected to said source, to said body, and to a metallic portion of said Schottky barrier.

9. The semiconductor device of claim 1, further comprising a back side metallization which is electrically connected to said drain and to a metallic portion of said Schottky barrier.

10. A semiconductor device, comprising:
    a Schottky barrier metal overlying a mesa of semiconductor material which is doped to less than $10^{17}$ cm$^{-3}$ n-type;
    a p-type guard ring, in said semiconductor material, which laterally surrounds the area of contact between said Schottky barrier metal and said semiconductor material;
    at least one isolation trench, flanking said mesa, which has an approximately constant potential;
    an additional n-type diffusion component, at intermediate depths within said mesa, which reduces the resistivity of said semiconductor at intermediate depths to less than the resistivity of said semiconductor material near said area of contact; and
    at least one p-type shield diffusion, lying at least partly below the bottom of said trench;
    whereby said p-type diffusion, in combination with said trench, shapes isopotential contours to provide an increased breakdown voltage.

11. The semiconductor device of claim 10, wherein said isolation trenches each include a respective field plate.

12. The semiconductor device of claim 10, wherein said Schottky barrier is provided by a contact between silicon and a metal silicide.

13. The semiconductor device of claim 10, wherein said Schottky barrier is provided by a contact between a metallic substance and a semiconductor which is doped to less than $10^{17}$ cm$^{-3}$.

14. The semiconductor device of claim 10, wherein said shield diffusions have a minimum net doping concentration of less than $10^{16}$ cm$^{-3}$.

15. The semiconductor device of claim 10, wherein said Schottky barrier is provided by a contact between platinum or titanium silicide and silicon, and is laterally surrounded by a p-type guard ring.

16. The semiconductor device of claim 10, wherein said shield diffusions have a maximum net doping concentration of more than $10^{17}$ cm$^{-3}$ p-type.

17. The semiconductor device of claim 10, wherein said source, body, drift, and drain regions all consist essentially of silicon.

18. The semiconductor device of claim 10, further comprising a frontside metallization which is electrically connected to said source, to said body, and to a metallic portion of said Schottky barrier.

19. A semiconductor device, comprising:
trench transistors, each including at least an n-type semiconductor source region and a p-type semiconductor body region defining a junction therebetween;
trench diodes, each including a Schottky barrier where a metallic material touches an n-type semiconductor anode region without making ohmic contact;
a termination region, containing at least some n-type intrinsically doped epitaxial semiconductor material, surrounding said trench transistors and trench diodes;
one or more semiconductor drift regions, lying at least partially below said body regions and/or said anode regions;
isolation trenches;
shield diffusions lying at least partly beneath said isolation trenches;
wherein at least some ones of said isolation trenches adjoin both a trench transistor and a trench diode;
wherein ones of said drift regions have a higher net n-type doping at depths near the bottom depth of said isolation trenches, than the doping of said n-type intrinsically doped epitaxial semiconductor material;
and wherein said shield diffusions shape depletion contours, when said transistors are off, to thereby reduce electric field at said Schottky barrier, and also at said junction between said source region and said body region.

* * * * *